United States Patent
Choi et al.

(10) Patent No.: US 12,232,350 B2
(45) Date of Patent: Feb. 18, 2025

(54) ELECTRONIC DEVICE INCLUDING DISPLAY SIDE PROTECTION MEMBER

(71) Applicant: SAMSUNG ELECTRONICS CO., LTD., Suwon-si (KR)

(72) Inventors: Jonghwan Choi, Suwon-si (KR); Namhyung Kim, Suwon-si (KR); Jihoon Kang, Suwon-si (KR); Seokki Kim, Suwon-si (KR); Chijoon Kim, Suwon-si (KR); Changyong Seo, Suwon-si (KR); Wonho Lee, Suwon-si (KR); Soonwan Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 302 days.

(21) Appl. No.: 17/749,734

(22) Filed: May 20, 2022

(65) Prior Publication Data

US 2022/0336772 A1    Oct. 20, 2022

Related U.S. Application Data

(63) Continuation of application No. PCT/KR2022/005153, filed on Apr. 8, 2022.

(30) Foreign Application Priority Data

Apr. 9, 2021  (KR) .................. 10-2021-0046705
Jul. 26, 2021  (KR) .................. 10-2021-0098028

(51) Int. Cl.
*G06F 1/16*    (2006.01)
*C09K 3/10*    (2006.01)
(Continued)

(52) U.S. Cl.
CPC ....... *H10K 50/8426* (2023.02); *C09K 3/1021* (2013.01); *G06F 1/1637* (2013.01);
(Continued)

(58) Field of Classification Search
CPC ............... H10K 50/8426; H10K 59/12; H10K 59/8791; H10K 59/8722; H10K 77/111;
(Continued)

(56) References Cited

U.S. PATENT DOCUMENTS 10,121,989 B2 * 11/2018 Park ..................... H10K 77/111
10,672,304 B2    6/2020 Choi et al.
(Continued)

FOREIGN PATENT DOCUMENTS

EP          3 684 035 A1    7/2020
KR    10-2009-0073873        7/2009
(Continued)

OTHER PUBLICATIONS

Search Report and Written Opinion dated Jun. 30, 2022 issued in International Patent Application No. PCT/KR2022/005153.
(Continued)

*Primary Examiner* — Rockshana D Chowdhury
(74) *Attorney, Agent, or Firm* — Nixon & Vanderhye P.C.

(57) ABSTRACT

Disclosed is a foldable electronic device including a sealing member for protecting a side surface of flexible display. A foldable electronic device according to various embodiments of the disclosure may include: a foldable housing configured to be folded and unfolded, a flexible display disposed in the foldable housing, the flexible display including a display panel configured to display image information and a cover window covering a first surface of the display panel on which image information is displayed, the display panel having at least one portion configured to be bent according to folding and unfolding operations of the foldable housing, and a seal contacting a region of a side part of the flexible display with reference to the first surface of the flexible display, the region including a space between the cover window and the display panel, wherein the seal may
(Continued)

include a polymer material which is configured to be bent according to the bending operation in a state of being in contact with a side surface of the flexible display during the bending operation of the flexible display.

20 Claims, 18 Drawing Sheets

(51) Int. Cl.
*H10K 50/842* (2023.01)
*H10K 59/12* (2023.01)

(52) U.S. Cl.
CPC .......... *G06F 1/1641* (2013.01); *G06F 1/1652* (2013.01); *G06F 1/1656* (2013.01); *G06F 1/1681* (2013.01); *C09K 2200/065* (2013.01); *H10K 59/12* (2023.02)

(58) Field of Classification Search
CPC ............ H10K 2102/311; C09K 3/1021; C09K 2200/065; G06F 1/1637; G06F 1/1641; G06F 1/1652; G06F 1/1656; G06F 1/1681
See application file for complete search history.

(56) References Cited

U.S. PATENT DOCUMENTS

| | | | |
|---|---|---|---|
| 10,838,458 | B1 | 11/2020 | Park et al. |
| 11,013,130 | B2 * | 5/2021 | Shin .................. G02F 1/133305 |
| 11,094,913 | B1 * | 8/2021 | Qin ...................... H10K 59/873 |
| 11,143,387 | B2 * | 10/2021 | Hirakata ............... F21V 15/012 |
| 2013/0293804 | A1 | 11/2013 | Kim |
| 2015/0062927 | A1 | 3/2015 | Hirakata et al. |
| 2017/0010634 | A1 * | 1/2017 | Ahn .................... H04M 1/0216 |
| 2017/0123461 | A1 | 5/2017 | Kim et al. |
| 2017/0222179 | A1 * | 8/2017 | Park ....................... H10K 59/12 |
| 2019/0086760 | A1 * | 3/2019 | Wang ............... G02F 1/133615 |
| 2020/0105168 | A1 | 4/2020 | Choi et al. |
| 2020/0225699 | A1 | 7/2020 | Yu et al. |
| 2021/0382367 | A1 * | 12/2021 | Hashimoto ........... G06F 1/1652 |
| 2021/0405688 | A1 * | 12/2021 | Barrett .................. G06F 1/1637 |
| 2022/0069249 | A1 * | 3/2022 | Kim ..................... H10K 50/841 |
| 2022/0118744 | A1 | 4/2022 | Ouyang et al. |
| 2022/0209180 | A1 * | 6/2022 | Song ....................... B32B 23/08 |
| 2022/0334617 | A1 * | 10/2022 | Chu .......................... H05K 5/06 |
| 2022/0390985 | A1 * | 12/2022 | Lee ....................... G06F 1/1616 |
| 2023/0070323 | A1 * | 3/2023 | Yoon .................... H10K 59/1213 |

FOREIGN PATENT DOCUMENTS

| | | |
|---|---|---|
| KR | 10-2011-0068352 | 6/2011 |
| KR | 10-2013-0122884 | 11/2013 |
| KR | 10-2017-0051854 | 5/2017 |
| KR | 10-2020-0036127 | 4/2020 |
| KR | 10-2020-0043045 | 4/2020 |
| KR | 10-2020-0062827 | 6/2020 |
| KR | 10-2020-0070904 | 6/2020 |
| KR | 10-2020-0073387 | 6/2020 |
| KR | 10-2020-0137902 | 12/2020 |
| WO | 2021-000605 | 1/2021 |

OTHER PUBLICATIONS

Extended European Search Report dated Apr. 9, 2024 for EP Application No. 22785028.6.

\* cited by examiner ated States, filed on Apr. 8, 2022, in the Korean Intellectual
ELECTRONIC DEVICE INCLUDING DISPLAY SIDE PROTECTION MEMBER

CROSS-REFERENCE TO RELATED APPLICATIONS

This application is a continuation of International Application No. PCT/KR2022/005153 designating the United States, filed on Apr. 8, 2022, in the Korean Intellectual Property Receiving Office and claiming priority to Korean Patent Application No. 10-2021-0046705, filed on Apr. 9, 2021, in the Korean Intellectual Property Office and Korean Patent Application No. 10-2021-0098028, filed on Jul. 26, 2021, in the Korean Intellectual Property Office, the disclosures of all of which are incorporated by reference herein in their entireties.

BACKGROUND

Field

The disclosure relates to an electronic device and, for example, to an electronic device including a display side protection member.

Description of Related Art

Electronic devices require small profiles for portability and require large display areas to provide a large amount of information to users. In order to ensure both small profiles and large display areas, various form factors of electronic devices have been tried, such as rollable, slidable, or foldable, in additional to conventional rectangular bar shapes. An electronic device having a foldable form factor, for example, needs a flexible display such that the same can bend or fold.

When a panel side protection member including a joint portion is used, a bending operation of a flexible display may increase the gap between the panel side and the protection member, and external foreign materials (for example, sand and dust) may infiltrate the panel side and may damage the panel. In addition, a panel side protection member including a joint portion having complicated maneuverability is assembled to a side of the flexible display through a separate assembly process, and this may increase the complexity of the electronic device manufacturing process.

SUMMARY

Embodiments of the disclosure may provide a display side protection member and an electronic device including the same, wherein the same is applicable to a side of a flexible display through a simple process while preventing or reducing infiltration of foreign materials t. A foldable electronic device according to various example embodiments of the disclosure may include: a foldable housing configured to be folded and unfolded, a flexible display disposed in the foldable housing, the flexible display including a display panel configured to display image information and a cover window configured to cover a first surface of the display panel on which image information is displayed, the display panel having at least one portion configured to be bent according to folding and unfolding operations of the foldable housing, and a seal in contact with a region of a side part of the flexible display with reference to the first surface of the flexible display, the region including a space between the cover window and the display panel, wherein the seal may include a polymer material configured to be bent according to the bending operation in a state of being in close contact with a side surface of the flexible display during the bending operation of the flexible display. In various example embodiments, the polymer material may have an elastic modulus of 5 Mpa or less, an elongation of 300% or more, and a Shore A hardness of 10 to 80. In various example embodiments, the polymer material may include a structure in which polymer chains are atypically tangled with each other, the polymer chain having repeating units, each of which includes at least one soft segment and at least one hard segment and has an average molecular weight of 10000 or more, and which are linearly polymerized. In an example embodiment, the polymer material may include at least one of silicone resin, amino resin, epoxy resin, phenol resin, polyester, or polyurethane.

In various example embodiments, the seal may be configured to be in close contact with the side surface of the display as the polymer material in a solution state is sprayed onto the side surface of the flexible display and then cured. In various example embodiments, the polymer material may have a viscosity of 1000 to 10000 cPs in a solution state.

In various example embodiments, the flexible display may further include: a protective layer covering an upper part of the cover window, and the seal may be in contact with a side part of a region including a space between the protective layer and the display panel. In various example embodiments, the flexible display may include a first adhesive layer bonding the protective layer and the cover window together, and the seal may be in contact with a region including a side part of the first adhesive layer and a region between the lower surface of the first adhesive layer and the upper surface of the display panel. In an example embodiment, the seal may be in contact with a region including a side part of the protective layer, a region between the protective layer and the display panel, and a side part of the display panel. In various example embodiments, the flexible display may include a rear cover positioned below the display panel and a support layer positioned below the rear cover, and the seal may be in close with a region of a side part of the display panel between the upper surface of the support layer and the upper surface the protective layer.

In various example embodiments, the seal may be applied to a side part of a portion of the flexible display which is bent during the folding operation of the foldable housing. In an example embodiment, the flexible display may include a chip on panel (COP) bending part positioned at an end in a direction perpendicular to an axis in which the bending operation is performed, and the seal may be applied to the COP bending part of the flexible display. In an example embodiment, the seal may be applied to the entire side part of the flexible display with reference to a first direction.

A flexible display of a foldable electronic device according to an example of the disclosure may include: a display panel configured to display image information, a cover window covering a first surface of the display panel on which image information is displayed, and a seal in contact with a region of a side part of the flexible display with reference to the first surface of the flexible display, the region including a space between the cover window and the display panel, wherein the flexible display may have at least one portion configured to be bent according to folding and unfolding operations of the foldable electronic device, and the seal may include a polymer material configured to be bent according to the bending operation while maintaining a state of being in contact with a side surface of the flexible display during the bending operation.

In various example embodiments, the polymer material may have an elastic modulus of 5 Mpa or less, an elongation of 300% or more, and a Shore hardness of 50 to 100. In various example embodiments, the polymer material may include a structure in which polymer chains are atypically tangled with each other, the polymer chain having repeating units, each of which includes at least one soft segment and at least one hard segment and has an average molecular weight of 10000 or more, and which are linearly polymerized.

In various example embodiments, the seal may be in contact with the side surface of the display as the polymer material in a solution state is sprayed onto the side surface of the flexible display and then cured. In various example embodiments, the polymer material may have a viscosity of 1000 to 10000 cPs in a solution state.

In various example embodiments, the flexible display may further include: a protective layer covering an upper part of the cover window, and the seal may be in contact with a side part of a region including a space between the protective layer and the display panel. In various example embodiments, the flexible display may include a rear cover positioned below the display panel and a support layer positioned below the rear cover, and the seal may be in contact with a region of a side part of the display panel between the upper surface of the support layer and the upper surface of the protective layer.

Various example embodiments disclosed herein may provide a display side protection member including a polymer material which is in close contact with a side of a flexible display, and which is bent according to bending operations of the flexible display, thereby preventing and/or reducing foreign materials from infiltrating the side during bending operations of the flexible display.

In addition, the polymer material of the side protection member has a viscosity of 1000 to 10000 cPs in a solution state such that, in the case of jetting to a display side, the same is prevented or reduced from tickling down (or tickles down less) and is highly penetrable. Accordingly, the same is applicable to a side of an electronic device through a simple process (for example, jetting), and thus may simplify the electronic device assembly process.

BRIEF DESCRIPTION OF THE DRAWINGS

In connection with the description of the drawings, same or similar reference numerals will be used to refer to same or similar elements. Further the above and other aspects, features and advantages of certain embodiments of the present disclosure will be more apparent from the following detailed description, taken in conjunction with the accompanying drawings, in which.

DETAILED DESCRIPTION

Figure 1:
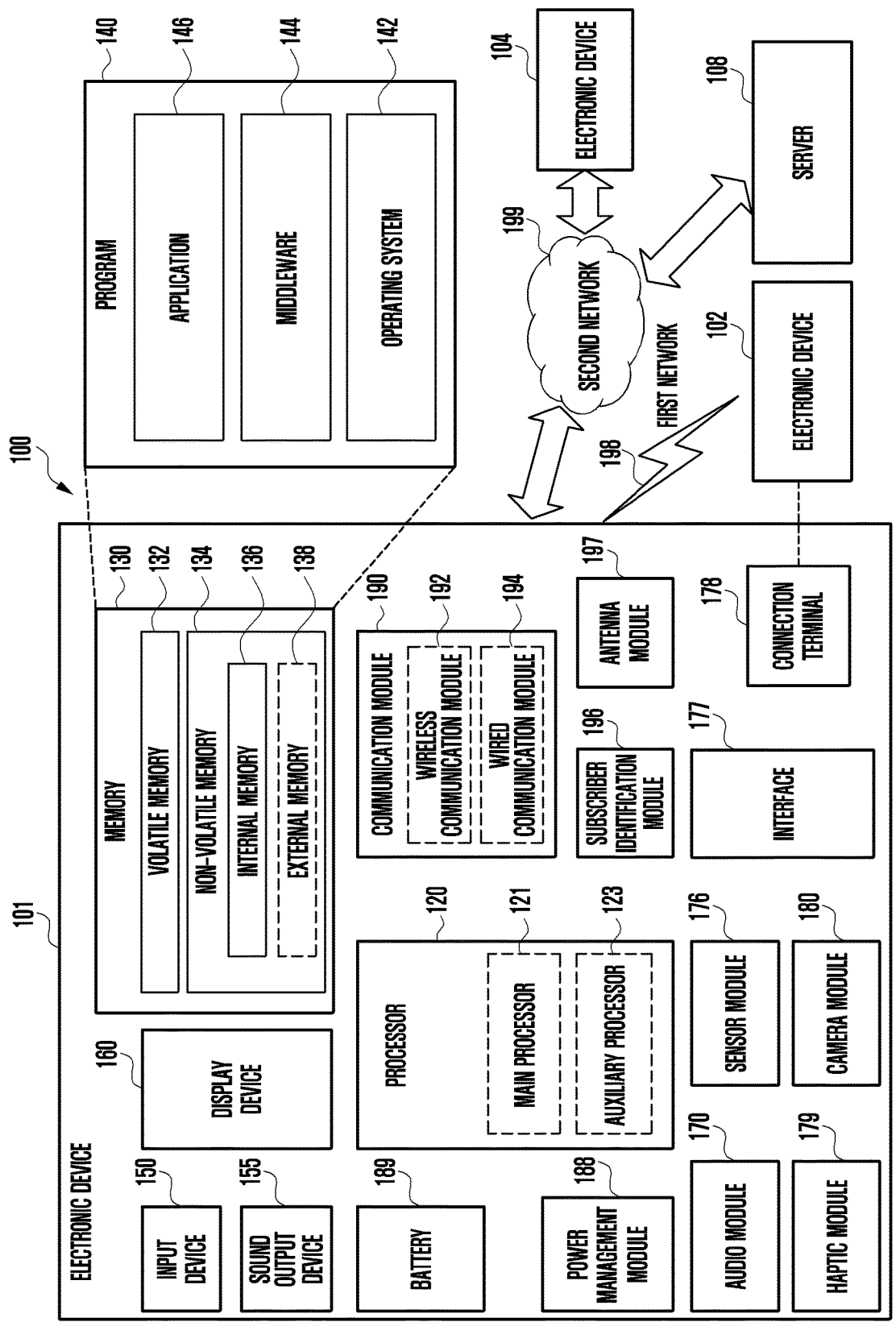
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments, a portable electronic device (e.g., an electronic device 101 of FIG. 1) may have a foldable housing divided into two housings with reference to a folding axis. A first portion of a display (e.g., a flexible display) may be disposed in a first housing, and a second portion thereof may be disposed in a second housing. The foldable housing may be implemented in an in-folding type in which the first portion and the second portion face each other when the portable electronic device is folded. The foldable housing may be also implemented in an out-folding type in which the first portion and the second portion face in opposite directions when the portable electronic device is folded. A surface, on which the first portion and the second portion of the display are arranged, may be referred to as a front surface of the portable electronic device, a surface opposite thereto may be referred to as a rear surface of the portable electronic device, and a surface, which is configured to surround a space between the front surface and the rear surface, may be referred to as a side surface of the portable electronic device.

According to an embodiment mentioned in the disclosure, the in-folding type, in which the first portion of the display of the first housing faces the second portion of the display of the second housing when the display of the portable electronic device is folded, is illustrated and described as an example. However, the out-folding type, in which the first portion of the display of the first housing is disposed to face in a direction opposite to the second portion of the display of the second housing when the display is folded according to an embodiment, may be also identically or similarly applied thereto. In addition, the embodiments may be identically or similarly applied to a multi-foldable electronic device in which the in-folding and the in-folding are combined, the in-folding and the out-folding are combined, or the out-folding and the out-folding are combined.

Figure 2A:
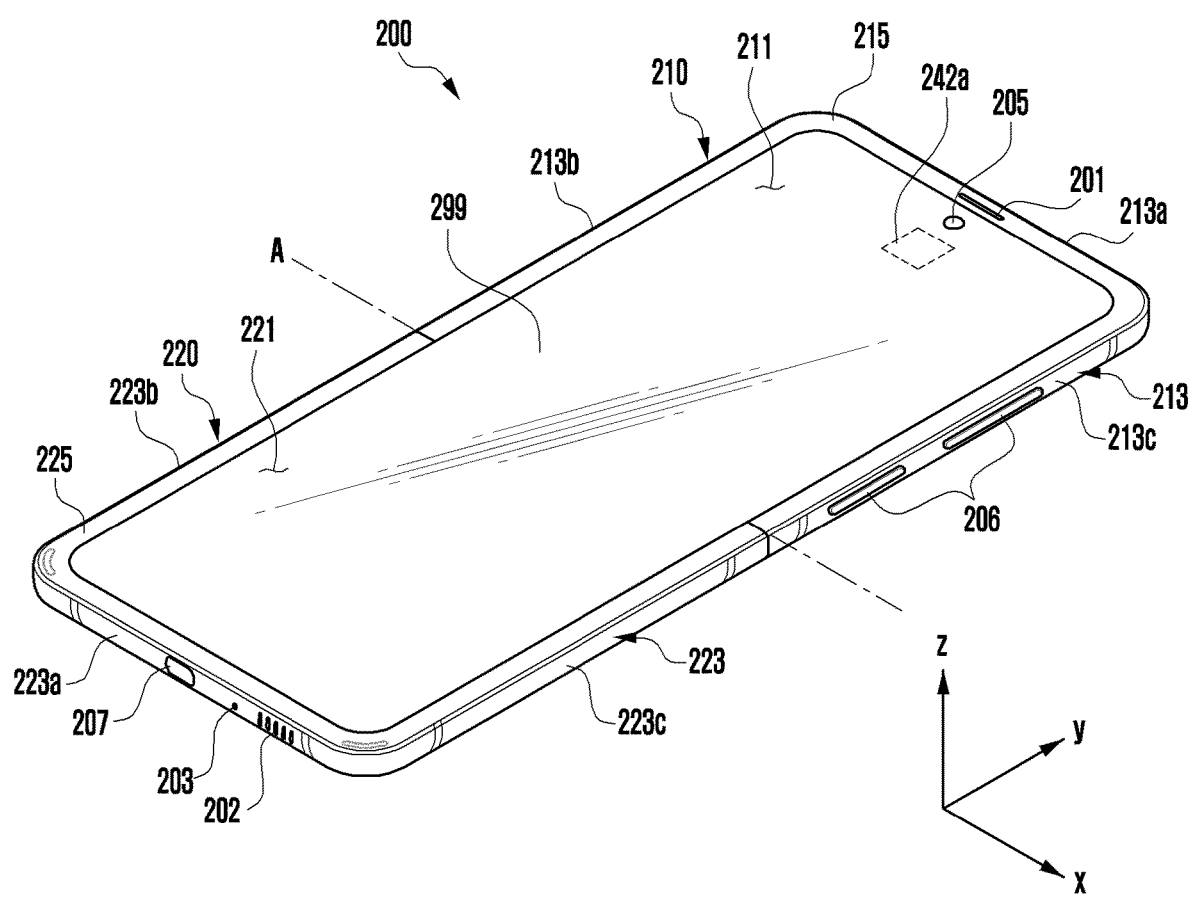
FIGS. 2A, 2B, 2C, 2D, 2E and 2F are various views illustrating a portable electronic device having an in-folding type housing structure according to various embodiments.
Figure 2B:
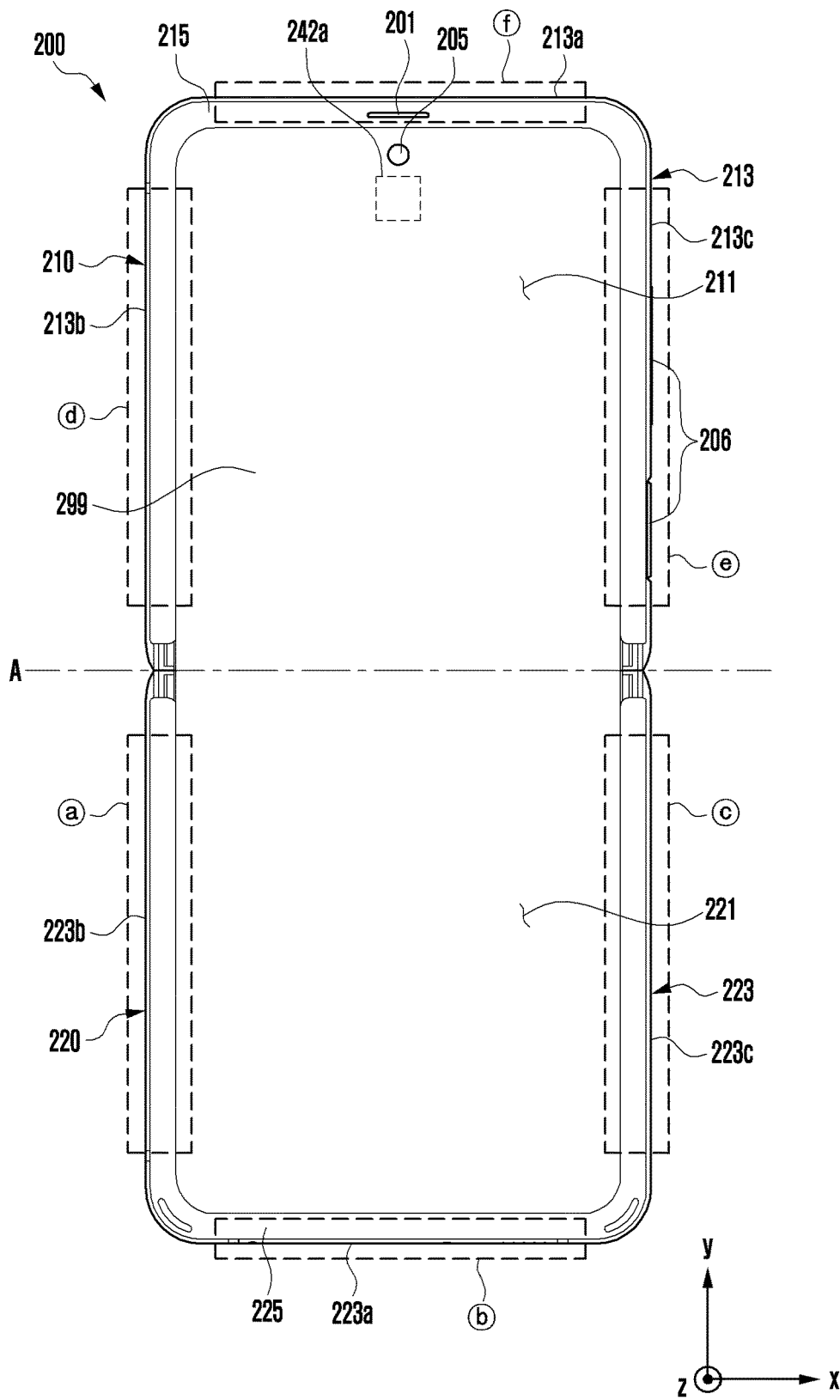
Figure 2C:
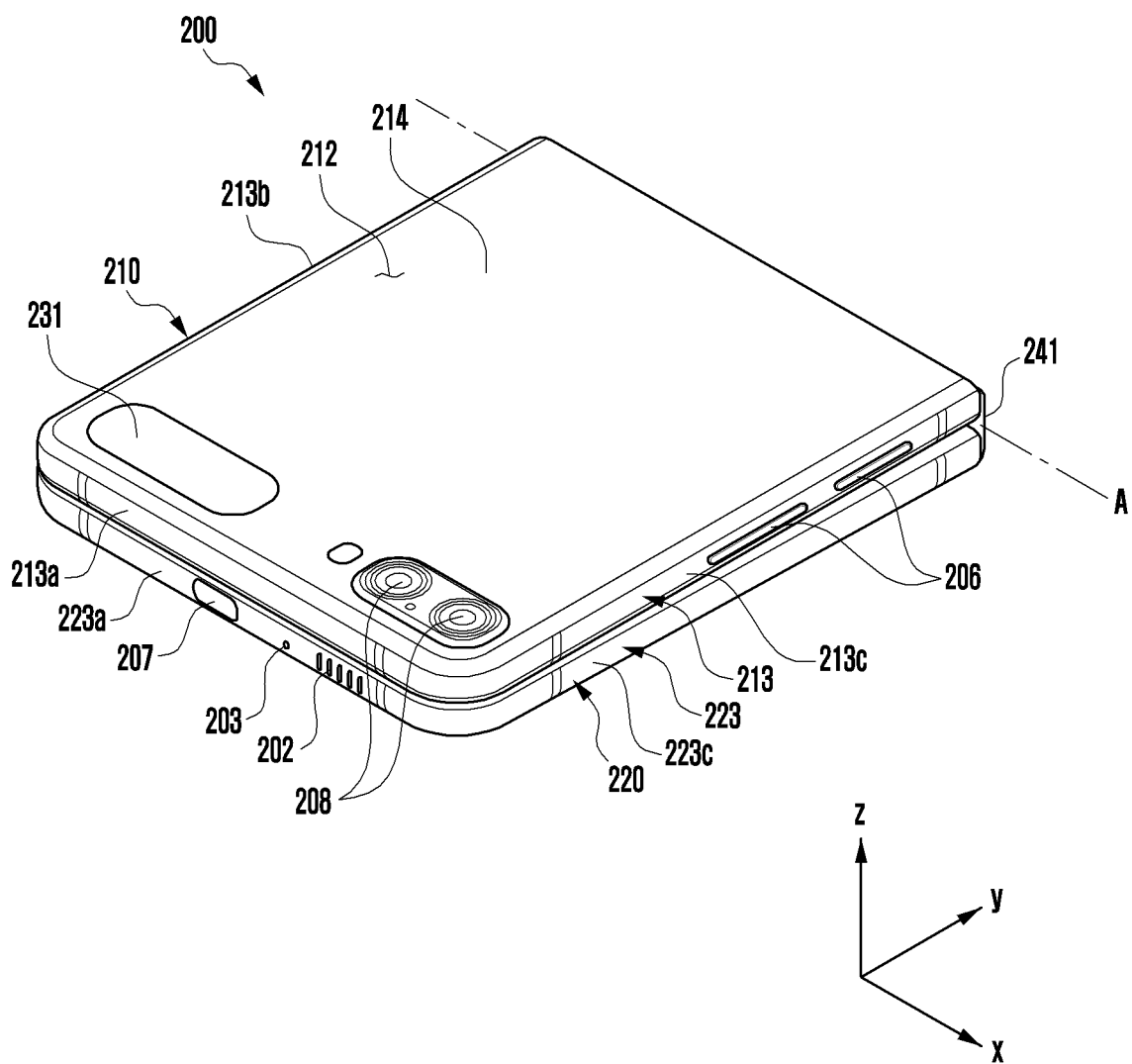
Figure 2D:
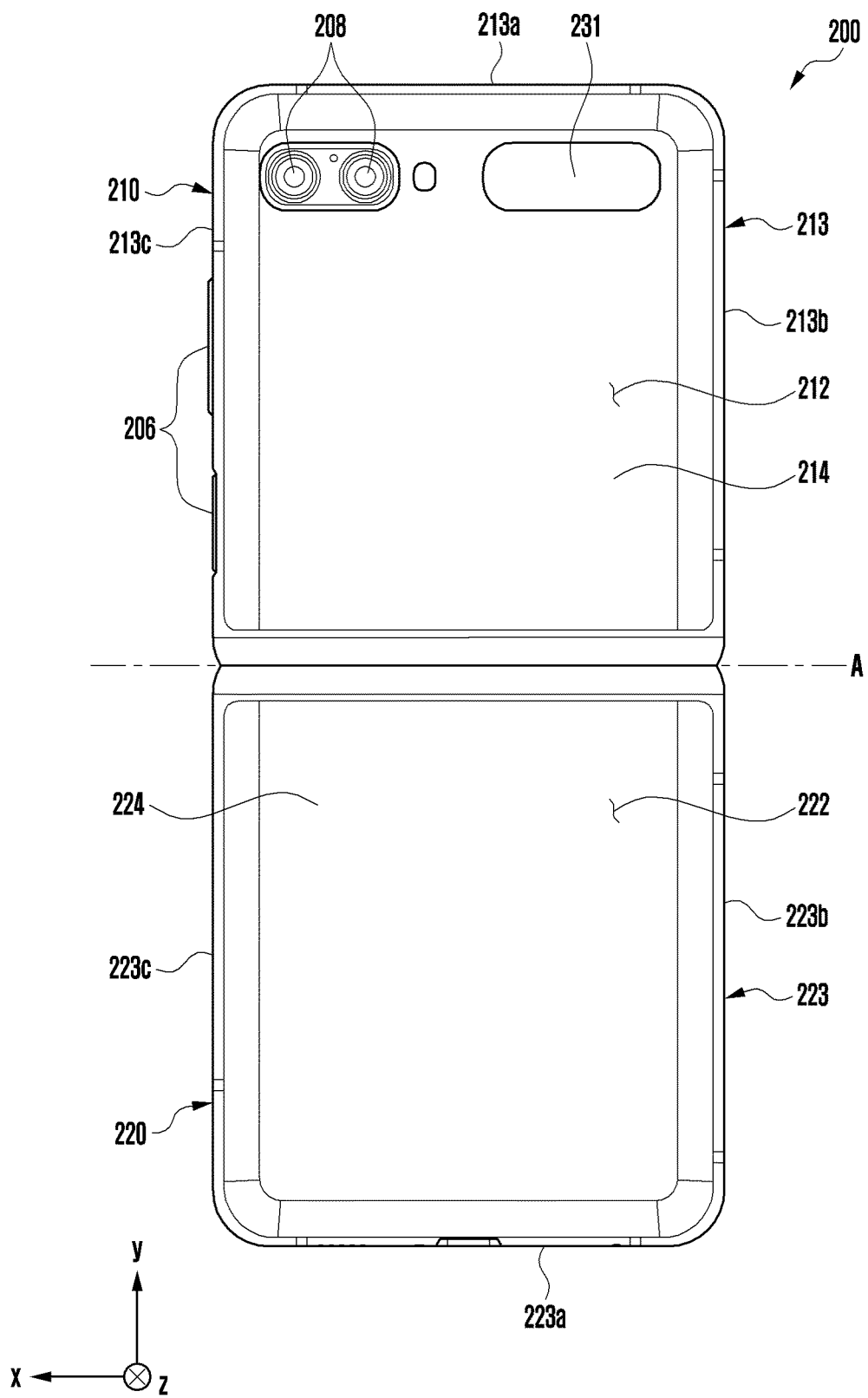
Figure 2E:
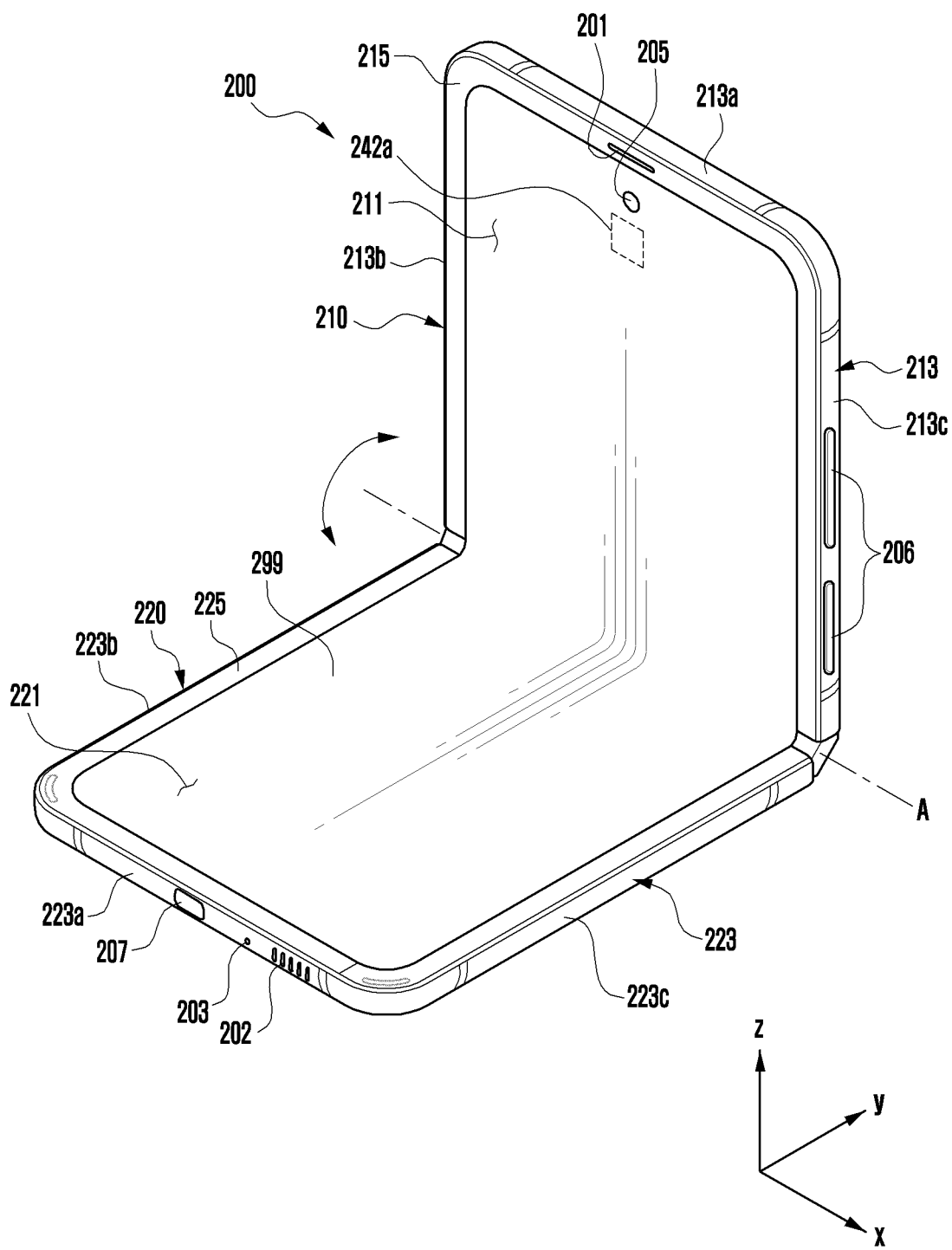
Figure 2F:
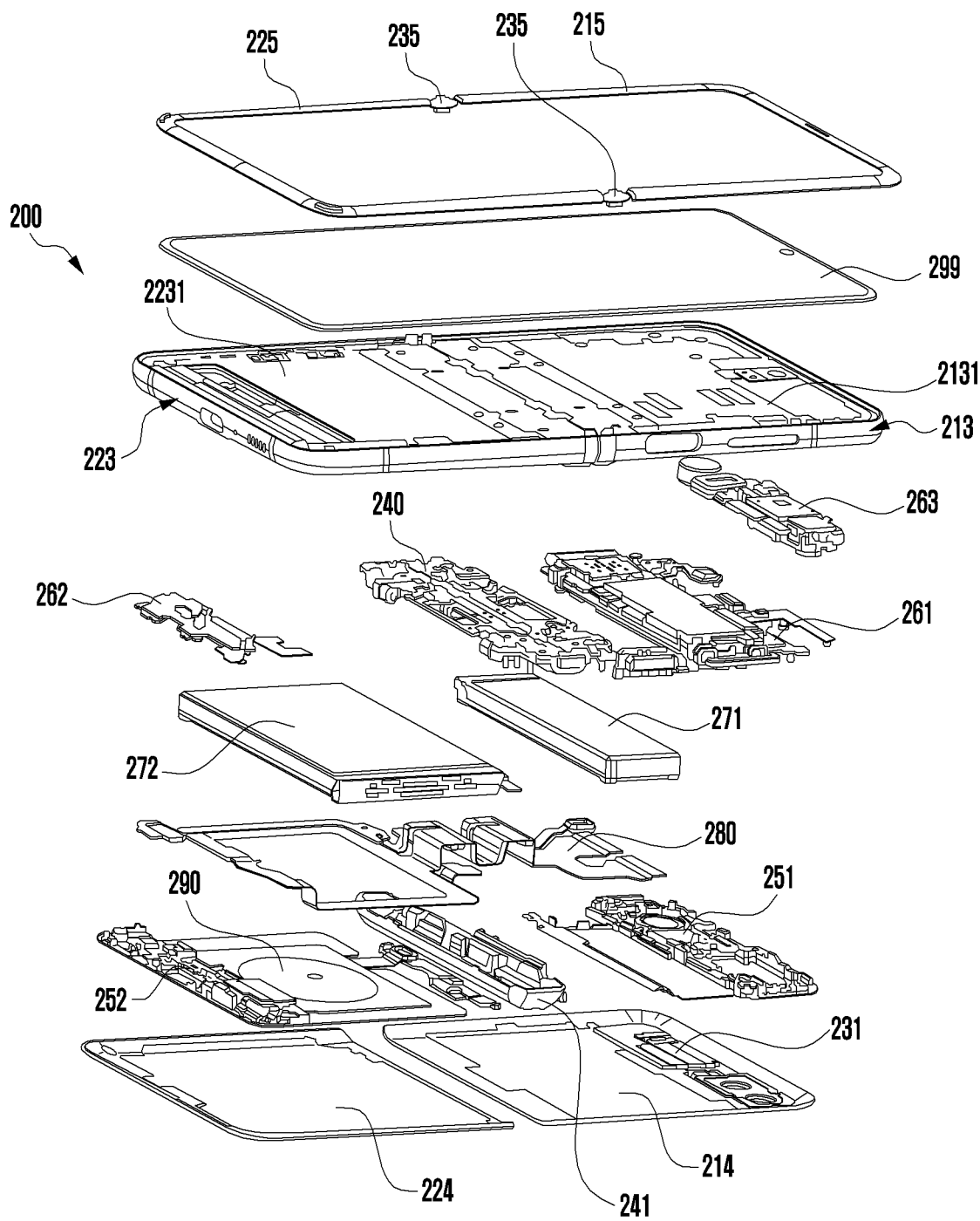

FIGS. 2A, 2B, 2C, 2D, 2E and 2F (which may be referred to herein as "FIGS. 2A to 2F") are various views illustrating an example portable electronic device 200 having an in-folding type housing structure according to various embodiments. For example, FIGS. 2A and 2B illustrate the front surface in a state where a foldable portable electronic device (hereinafter, referred to as an electronic device) according to various embodiments is unfolded (flat or open), FIG. 2C illustrates the rear surface in a state where the electronic device is folded (or closed), FIG. 2D illustrates the rear surface in the unfolded state, FIG. 2E illustrates the front surface in a partially folded state (in other words, a partially unfolded state or an intermediate state (a free stop state)

between a fully folded state and a fully unfolded state), and FIG. 2F is an exploded perspective view of the electronic device.

Referring to FIGS. 2A to 2F, the portable electronic device 200 (e.g., the electronic device 101 of FIG. 1) may include a first housing 210, a second housing 220, a hinge assembly 240 configured to connect the first housing 210 and the second housing 220 such that the second housing 220 is rotatable with respect to the first housing 210, a flexible or foldable display 299 arranged in a space formed by the foldable housings 210 and 220, and a sensor module (e.g., the sensor module 176 of FIG. 1).

The display 299 may be disposed from the first housing 210 up to the second housing 220 to traverse the hinge assembly 240. The display 299, with reference to a folding axis A, may be divided into a first display region 211 disposed in an inner space of the first housing 210 and a second display region 221 disposed in an inner space of the second housing 220. The sensor module (e.g., an illuminance sensor) may be disposed below a sensor region 242a (or a light transmitting region) of the first display region 211 when seen from the front surface thereof. The position and/or size of the sensor region 242a in the first display region 211 may be determined by the position and/or size of the illuminance sensor disposed therebelow. For example, the size (e.g., the diameter) of the sensor region 242a may be determined based on a field of view (FOV) of the illuminance sensor. In an embodiment, the sensor region 242a, in order for light transmissivity improvement, may be configured to have a pixel density and/or a wire density lower than that of the periphery thereof.

The hinge assembly 240 may be implemented in the in-folding type in which the two display regions 211 and 221 face each other when the portable electronic device 200 is changed from an unfolded state (e.g., the state of FIG. 2A) into a folded state (e.g., the state of FIG. 2C). For example, when the electronic device 200 is an unfolded state, the two display regions 211 and 221 may face a substantially identical direction. According to changing from an unfolded state into a folded state, the two display regions 211 and 221 may be configured to rotate in a direction facing each other. The hinge assembly 240 may be configured to have a resistance force against rotation of the foldable housings 210 and 220. When an external force exceeding the resistance force is applied to the foldable housings 210 and 220, the foldable housings 210 and 220 may rotate.

A state of the electronic device 200 may be defined based on an angle formed between the two display regions 211 and 221. For example, when the angle between the two display regions 211 and 221 is about 180 degrees, the state of the electronic device 200 may be defined as an unfolded (flat or open) state. When the angle between the two display regions 211 and 221 is an angle between about zero and 10 degrees, the state of the portable electronic device 200 may be defined as a folded (closed) state. When the two display regions 211 and 221 form an angle (e.g., an angle between about ten to 179 degrees) which is greater than the angle of the folded state and smaller than the angle of the unfolded state, as illustrated in FIG. 2E, the state of the portable electronic device 200 may be defined as an intermediate state (in other words, a partially folded state or a partially unfolded state).

Based on a state of the portable electronic device 200, an active region, on which visual information (e.g., a text, an image, or an icon) is displayed in the display 299, may be determined. For example, when the electronic device 200 is an intermediate state, an active region may be determined as the first display region 211 or the second display region 221. A region, which has a relatively smaller movement of the first display region 211 and the second display region 221, may be determined as an active region. For example, in a state where a user grips a housing of the electronic device 200 with one hand, when the user opens the other housing with a finger (e.g., a thumb) of the same hand or with the other hand, the electronic device 200 may be changed from a folded state into an intermediate state, and thus the display region of the gripped housing (e.g., a housing having a relatively smaller movement) may be determined as an active region of the electronic device 200. When the portable electronic device 200 is an unfolded state, the whole region (e.g., both first display region 211 and second display region 221) of the display 299 may be determined as an active region.

According to various embodiments, in an unfolded state, the first housing 210 may include a first surface (the first display region) 211 facing a first direction (e.g., the front direction) (the z-axis direction) and the second surface 212 facing a second direction (e.g., the rear direction) (the −z-axis direction) opposite to the first surface 211. In an unfolded state, the second housing 220 may include a third surface (the second display region) 221 facing the first direction (e.g., the z-axis direction) and a fourth surface 222 facing the second direction (e.g., −z-axis direction). In an unfolded state, electronic device 200 may operate in a form in which the first surface 211 of the first housing 210 and the third surface 221 of the second housing 220 face the same first direction (e.g., the z-axis direction), and in a folded state, the electronic device 200 may operate in form in which the first surface 211 and the third surface 221 face each other. In an unfolded state, the electronic device 200 may operate in a form in which the second surface 212 of the first housing 210 and the fourth surface 222 of the second housing 220 face the same second direction (e.g., the −z-axis direction), and in a folded state, the electronic device 200 may operate in a form in which the second surface 212 and the fourth surface 222 face each other.

According to various embodiments, the first housing 210 may include a first side frame 213 configured to at least partially form the outer shape of the electronic device 200, and a first rear cover 214 coupled to first side frame 213 and configured to form at least a part of the second surface 212 of the electronic device 200. According to an embodiment, the first side frame 213 may include a first side surface 213a, a second side surface 213b configured to extend from one end of the first side surface 213a, and a third side surface 213c configured to extend from the other end of the first side surface 213a. According to an embodiment, the first side frame 213 may be formed in a long rectangular shape (e.g., the square or rectangle) by the first side surface 213a, the second side surface 213b, and the third side surface 213c.

A part of the first side frame 213 may be formed of a conductor. For example, referring to FIG. 2B, a part ⓕ of the first side surface 213a, a part ⓓ of the second side surface 213b, and a part ⓔ of the third side surface 213c may be formed of a metal material. The conductor may be electrically connected to a grip sensor (not shown) disposed in the inner space of the first housing 210 to be adjacent thereto. A processor may measure capacitance formed between the conductor and a ground (e.g., a ground of a main printed circuit board) through the grip sensor, and based on the measured capacitance value, may recognize that a dielectric (e.g., a finger, palm, or face) closely approaches to (or is in contact with) the first housing 210 and, in the first housing 210 may recognize a portion (e.g., the first side surface 213a, the second side surface 213b, or the third side surface 213c) with which a dielectric is in contact.

According to various embodiments, the second housing 220 may include a second side frame 223 configured to at least partially form the outer shape of the electronic device 200, and a second rear cover 224 coupled to second side frame 223 and configured to form at least a part of the fourth surface 222 of the electronic device 200. According to an embodiment, the second side frame 223 may include a fourth side surface 223a, a fifth side surface 223b configured to extend from one end of the fourth side surface 223a, and a sixth side surface 223c configured to extend from the other end of the fourth side surface 223a. According to an embodiment, the second side frame 223 may be formed in a long rectangular shape by the fourth side surface 223a, the fifth side surface 223b, and the sixth side surface 223c.

A part of the second side frame 223 may be formed of a conductor. For example, referring to FIG. 2B, a part ⓑ of the fourth side surface 223a, a part ⓐ of the fifth side surface 223b, and a part ⓒ of the sixth side surface 223c may be formed of a metal material. The conductor may be electrically connected to a grip sensor (not shown) disposed in the inner space of the second housing 220 to be adjacent thereto. A processor may measure capacitance formed between the conductor and a ground (e.g., a ground of a main printed circuit board) through the grip sensor, and based on the measured capacitance value, may recognize that a dielectric closely approaches to (or is in contact with) the second housing 220 and, in the second housing 220 may recognize a portion (e.g., the fourth side surface 223a, the fifth side surface 223b, or the sixth surface 223c) with which a dielectric is in contact.

According to various embodiments, the pair of housings 210 and 220 may not be limited to the illustrated shape and coupling, and may be implemented by a combination and/or coupling between other shapes or components. For example, the first side frame 213 may be integrally formed with the first rear cover 214, and the second side frame 223 may be integrally formed with the second rear cover 224.

According to various embodiments, for example, the first rear cover 214 and the second rear cover 224 may be formed by at least one of coated or colored glass, ceramic, polymer, or metal (e.g., aluminum, stainless steel (STS), or magnesium), or a combination of at least two thereof.

According to various embodiments, the electronic device 200 may include a first protective cover 215 (e.g., a first protective frame or a first decoration member) coupled along the rim of the first housing 210. The electronic device 200 may include a second protective cover 225 (e.g., a second protective frame or a second decoration member) coupled along the rim of the second housing 220. According to an embodiment, the first protective cover 215 and the second protective cover 225 may be made of a metal or a polymer material.

According to various embodiments, the electronic device 200 may include a sub-display 231 disposed separately with the display 299. According to an embodiment, the sub-display 231 may be disposed on the second surface 212 of the first housing 210 to be at least partially exposed therefrom, and thus may display state information of the electronic device 200 when being in a folded state. According to an embodiment, the sub-display 231 may be disposed to be seen from the outside through at least a partial region of the first rear cover 214. In various embodiments, the sub-display 231 may be disposed on the fourth surface 222 of the second housing 220. In this case, the sub-display 231 may be disposed to be seen from the outside through at least a partial region of the second rear cover 224.

According to various embodiments, the electronic device 200 may include at least one among an input device 203, sound output devices 201 and 202, camera modules 205 and 208, a key input device 206, a connector port 207, and a sensor module (not shown). In an embodiment, the sensor module (e.g., the sensor module 176 of FIG. 1) and the camera 205 may be disposed below the display 299 when seen from the front surface thereof.

According to various embodiments, the electronic device 200 may operate to maintain the intermediate state through the hinge assembly 240. In this case, the electronic device 200 may be configured to control the display 299 such that contents different form each other are respectively displayed on a display region corresponding to the first surface 211 and a display region corresponding to the third surface 221.

Referring to FIG. 2F, the electronic device 200 according to various embodiments may include the first side frame 213, the second side frame 223, and the hinge assembly 240 configured to rotatably connect the first side frame 213 and the second side frame 223. According to an embodiment, the electronic device 200 may include a first support plate 2131 configured to at least partially extend from the first side frame 213, and a second support plate 2231 configured to at least partially extend from the second side frame 223. According to an embodiment, the first support plate 2131 may be integrally formed with the first side frame 213, or may be structurally coupled to the first side frame 213. Similarly, the second support plate 2231 may be integrally formed with the second side frame 223, or may be structurally coupled to the second side frame 223. According to an embodiment, the electronic device 200 may include the display 299 disposed to be supported by the first support plate 2131 and the second support plate 2231. According to an embodiment, the electronic device 200 may include the first rear cover 214 which is coupled to the first side frame 213 and provides a first space between same and the first support plate 2131, and the second rear cover 224 which is coupled to the second side frame 223 and provides a second space between same and the second support plate 2231. In various embodiments, the first side frame 213 and the first rear cover 214 may be integrally formed with each other. In various embodiments, the second side frame 223 and the second rear cover 224 may be integrally formed with each other. According to an embodiment, the electronic device 200 may include the first housing 210 provided through the first side frame 213, the first support plate 2131, and the first rear cover 214. According to an embodiment, the electronic device 200 may include the second housing 220 provided through the second side frame 223, the second support plate 2231, and the second rear cover 224.

Even though not illustrated therein, the hinge assembly 240 may include a first arm structure coupled to the first housing 210 (e.g., the first support plate 2131), a second arm structure coupled to the second housing 220 (e.g., second support plate 2231), and a detent structure which is physically in contact with the first arm structure and the second arm structure to allow the first housing 210 and second housing 220 to have a resistance force against rotation thereof. The foldable housings 210 and 220 may have a resistance force against rotation thereof by contact force (e.g., force of pushing the first arm structure and the second arm structure) of the detent structure.

According to various embodiments, the electronic device 200 may include a first substrate assembly 261 (e.g., a main printed circuit board), a camera assembly 263, a first battery 271, or a first bracket 251 which are arranged in the first space between the first side frame 213 and the first rear cover 214. According to an embodiment, the camera assembly 263 may include multiple cameras (e.g., the camera modules 205 and 208 of FIGS. 2A and 2C), and may be electrically connected to the first substrate assembly 261. According to an embodiment, the first bracket 251 may provide a support structure and improved rigidity for supporting the first substrate assembly 261 and/or the camera assembly 263. According to an embodiment, the electronic device 200 may include a second substrate assembly 262 (e.g., a sub-printed circuit board), an antenna 290 (e.g., a coil member), a second battery 272, or a second bracket 252 which are arranged in the second space between the second side frame 223 and the second rear cover 224. According to an embodiment, the electronic device 200 may include a wire member 280 (e.g., a flexible printed circuit board (FPCB)) which is configured to traverse the hinge assembly 240 from the first substrate assembly 261, is disposed to extend up to multiple electronic components (e.g., the second substrate assembly 262, the second battery 272, or the antenna 290) arranged between the second side frame 223 and the second rear cover 224, and provides an electrical connection.

According to various embodiments, the electronic device 200 may include a hinge cover 241 configured to support the hinge assembly 240, be exposed to the outside when the electronic device 200 is a folded state, and be disposed not to be seen from the outside by being inserted into the first space and the second space when being in an unfolded state.

According to various embodiments, the electronic device 200 may include a first protective cover 215 coupled along the rim of the first side frame 213. According to an embodiment, the electronic device 200 may include a second protective cover 225 coupled along the rim of the second side frame 223. In the display 299, the rim of the first display region 211 may be protected by the first protective cover 215. The rim of the second display region 221 may be protected by the second protective cover 225. A protective cap 235 may be disposed in a region corresponding to the hinge assembly 240 so as to protect a portion to be bent among the rim of the display 299.

Figure 3A:
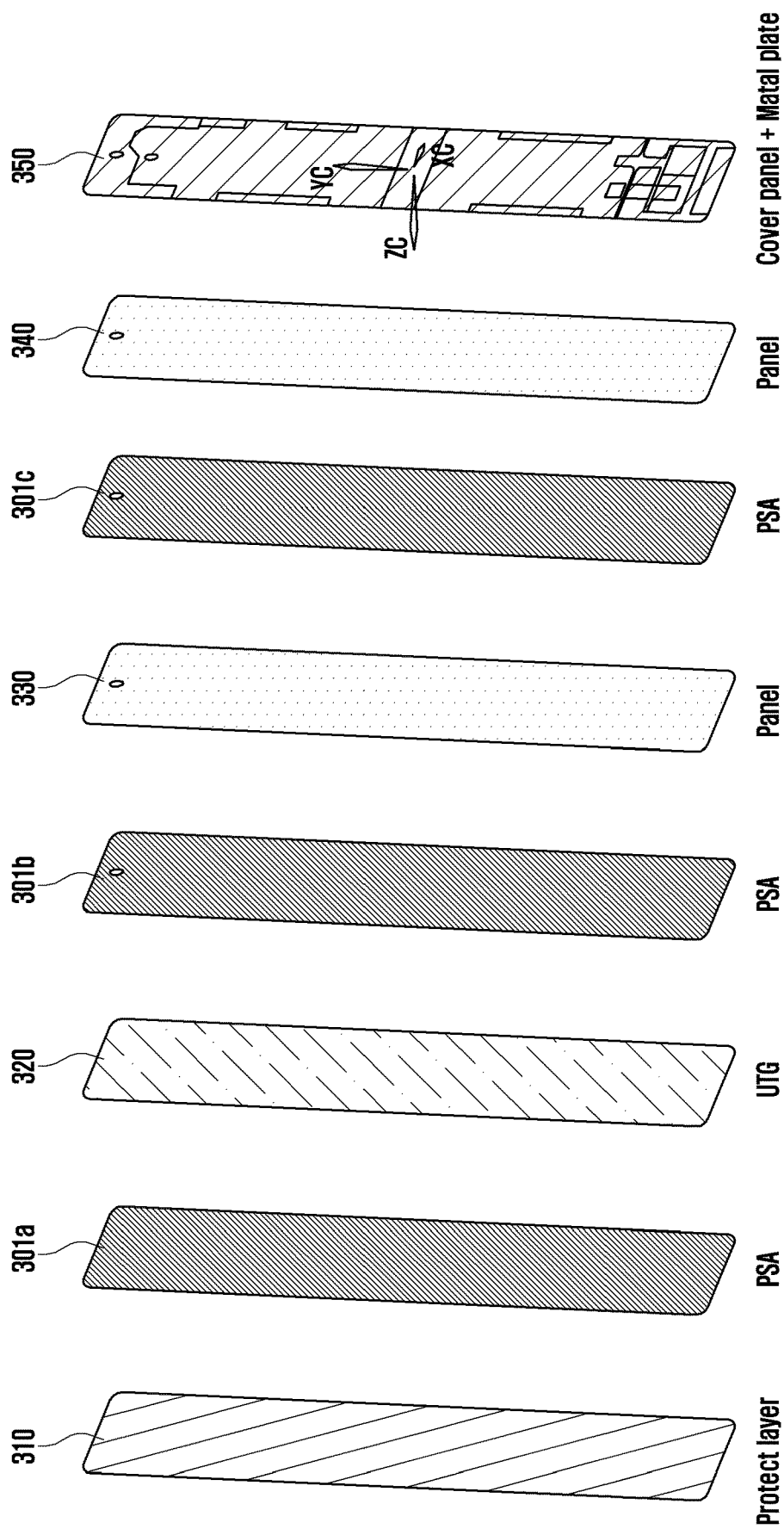
FIG. 3A is an exploded perspective view of a flexible display according to various embodiments.

FIG. 3A is an exploded perspective view illustrating a flexible display 300 according to various embodiments.

Figure 3B:
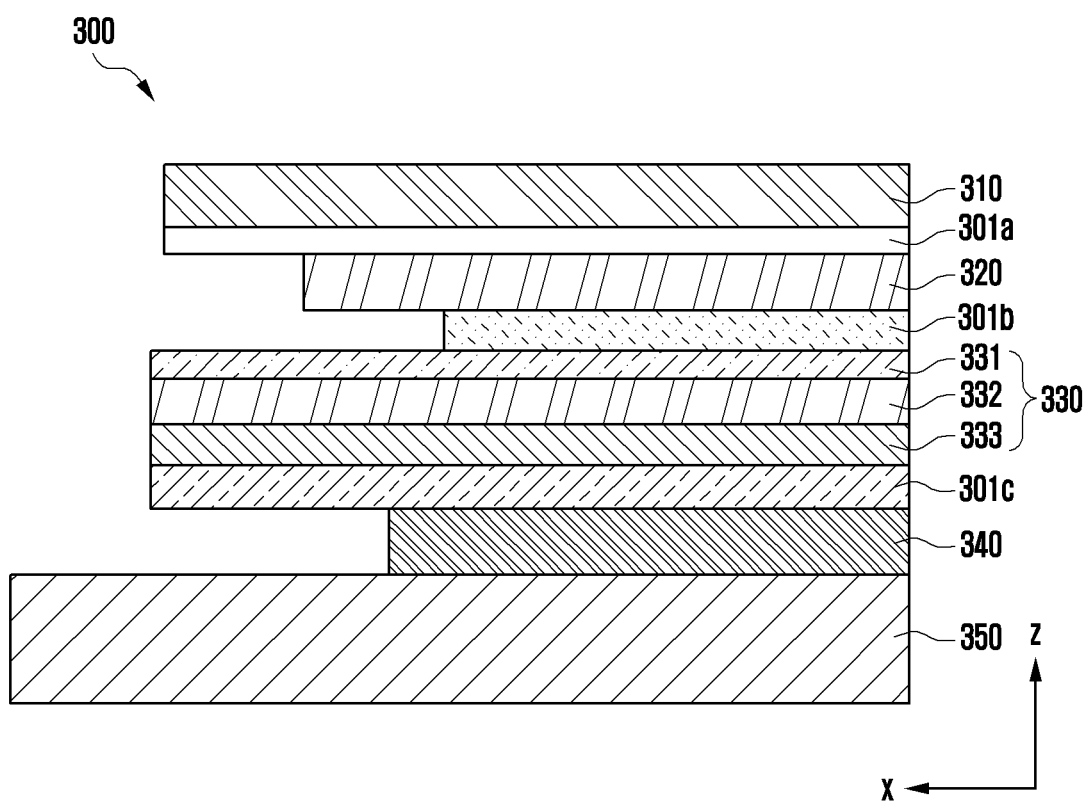
FIG. 3B is a sectional view illustrating a cross section of a flexible display according to various embodiments.

FIG. 3B is a sectional view illustrating a cross section of a flexible display 300 according to various embodiments.

The cross section of FIG. 3B is a cross section cut along A-A' direction of FIG. 3A.

In FIGS. 3A and 3B, the z-axis direction on the drawing may be generally referred to as an upper side, an upper part, or an upper surface which are a side of the flexible display 300, on which image information is displayed, and a direction perpendicular to the z-axis may be referred to as a lateral side, a side part, or a side surface.

Referring to FIG. 3A and FIG. 3B, the flexible display 300 (e.g., the display 299 of FIG. 2) may include a protective layer 310, a cover window 320, a display panel 330, a rear cover 340, and a support layer 350. The protective layer 310 may be a layer configured to protect the flexible display 300 from contaminations, scratches, and external physical damages. In various embodiments, the protective layer 310 may include a synthetic resin film such as PET or polyurethane.

The cover window 320 may be a layer configured to provide rigidity to the front surface of the display panel 330, and protect the display panel 330 from external forces such as stabbing or pressing. In various embodiments, the cover window 320 may include a transparent polymer material such as transparent polyimide (colorless polyimide) and/or an ultra-thin glass material. An ultra-thin glass may be bendable and may have an advantage in terms of a relatively large resistance to rigidity and external force. The ultra-thin glass may have a thickness of 100 μm or less in order to maintain flexibility.

The display panel 330 may be a region on which image information is displayed. The display panel 330 may include an AMOLED or an electroluminescent display similar thereto. In various embodiments, the display panel 330 may include a polarization film 331, a panel region 332, and a flexible film 333 (plastic film). The panel region 332, for example, like an AMOLED, may include multiple light-emitting elements, an electrode configured to supply power to a light-emitting element, and a control circuit. The polarization film may be positioned above the panel region 332, and may polarize light emitted from the panel region 332 and reflected light reflected from the rear surface of the panel region 332 to reduce visibility degradation caused by the reflected light. The flexible film 333 may include a substrate configured to allow the panel region 332 to be formed thereon. The flexible film 333 may include a substrate made of a synthetic resin material capable of providing flexibility to the display panel 330.

In various embodiments, the display panel 330 may include a touch screen panel (not shown). If the display panel 330 has a touch screen panel embedded therein, the entire thickness of a display may become thinner, and a region, on which image is displayed, and a region, in which a touch input is received, may be adjacent to each other in the thickness direction thereof. Therefore, there is an effect to improve a user experience at the time of touch.

The support layer 350 may help to reinforce rigidity of an electronic device, may block ambient noise generated from other elements of an electronic device, and may be used to spread heat generated during an operation of the display panel 330. The support layer 350 may include a metal material. The metal may have electrical and thermal conductivities so that noise can be effectively blocked and heat can be effectively spread. The metal may include stainless steel, aluminum, copper, or a composite (e.g., a member in which different types of metals are stacked in a plate shape) thereof. In various embodiments, the support layer 350 may include a lattice plate structure, which can be bent following a bending operation of the flexible display 300 and can mechanically support elements of the flexible display 300.

In various embodiments, the flexible display 300 may include the rear cover 340 positioned between the display panel 330 and the support layer 350. The rear cover 340 may block ingress of foreign materials to the rear surface of the display panel 330, and may reduce a mechanical stress applied from the rear direction of the display panel 330 to reduce damage of the display panel 330.

In various embodiments, flexible display 300 may include at least one adhesive layer 301a, 301b, and 301c configured to mutually bond at least two layers of the protective layer 310, the cover window 320, the display panel 330, the rear cover 340, and the support layer 350. For example, the flexible display 300 may include a first adhesive layer 301a configured to bond the protective layer 310 and the cover window 320, a second adhesive layer 301b configured to bond the cover window 320 and a panel, and a third adhesive layer 301c configured to bond the panel region 332 and the rear cover 340.

In various embodiments, the adhesive layer 301a, 301b, and 301c may include a pressure sensitive adhesive such as a pressure sensitive adhesive (PSA). The flexible display 300 should be bent, and thus it should be possible that multiple layers included in the flexible display 300 are slipped therebetween. Therefore, when each of layers is bonded with a pressure sensitive adhesive having a low shear modulus and a high elastic limit, the multiple layers of the flexible display 300 may be slipped away from each other while maintaining an adhesive state by the PSA. In an embodiment, the adhesive layer 301a, 301b, and 301c may include a transparent adhesive such as an optical clear adhesive (OCA).

FIGS. 4A, 4B, 4C, 4D, 4E and FIG. 4F (which may be referred to as "FIGS. 4A to 4F") are sectional views illustrating a sealing member 401 of a flexible display 300 of an electronic device according to various embodiments.

Figure 4A:
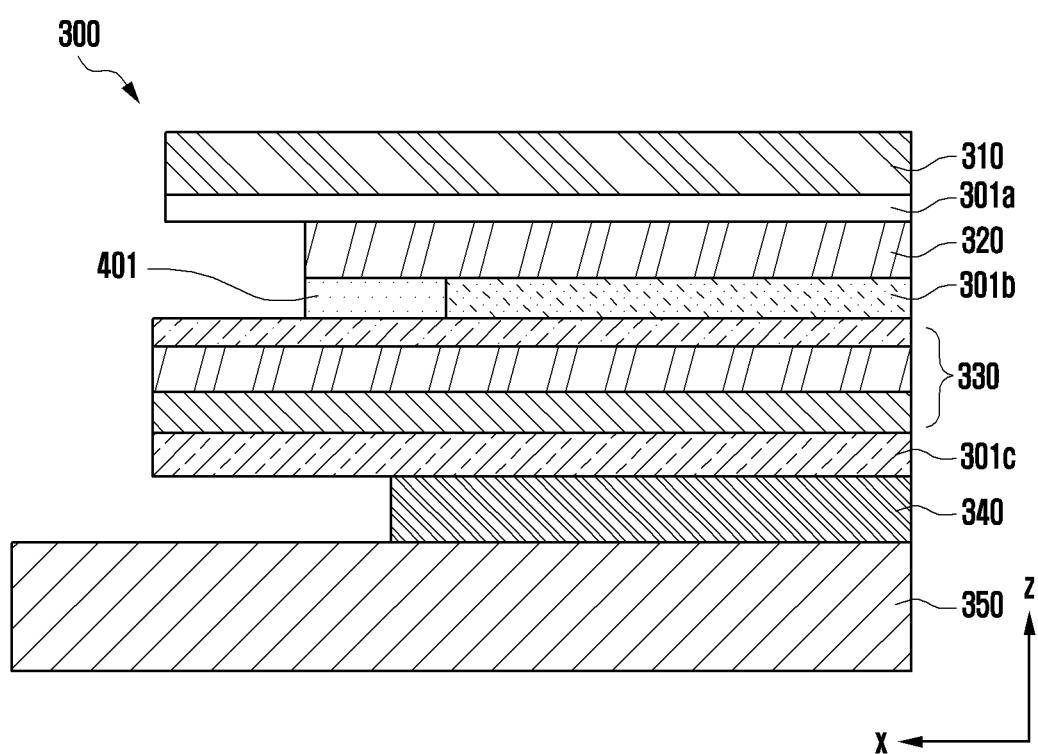
FIGS. 4A, 4B, 4C, 4D, 4E and FIG. 4F are various sectional views illustrating a sealing member of a flexible display of an electronic device according to various embodiments.

Referring to FIG. 4A, a sealing member 401, in a side surface of the flexible display 300, may come into close contact (e.g., contacting, bonded to, attached to, etc.) with a region including a space between the cover window 320 and the display panel 330. In the flexible display 300, in order to allow a slip, which corresponds to a shear stress during a bending operation, between layers, a step or a gap may exist between the lower surface of the cover window 320 and the upper surface of the display panel 330. When granular impurities are introduced into the above described gap, the impurities may press the display panel 330 to damage the display panel 330 during a bending operation thereof. In addition, during a slip, which occurs during a bending operation, between layers of the flexible display 300, the impurities may cause a scratch on each of layers between layers slipped to each other. The sealing member 401 may close the above described region to reduce damage of the display panel 330, caused by ingress of the impurities.

The sealing member 401 may include a polymer material. When the flexible display 300 is bent, the polymer material may cause the sealing member 401 to be bent according to a bending operation of the flexible display 300 while maintaining a state where the sealing member is in close contact with a region on the side surface of a flexible display. When the flexible display 300 is bent, multiple layers (e.g., such as the cover window 320 and the display panel 330) included in the flexible display 300 may be bent with different curvatures while making a slip between each other. The polymer material of the sealing member 401 may have elasticity and elongation which enable the sealing member to be bent while maintaining a state of being in close in contact with the above described multiple layers of the flexible display 300. Detailed configurations and physical properties of the polymer material will be described later.

In various embodiments, that the sealing member 401 comes into close contact therewith may refer, for example, to the sealing member 401 being bonded and/or attached thereto. In various embodiments, the sealing member 401, in the side surface of the flexible display 300, may be bonded to a region including a space between the cover window 320 and the display panel 330. In an embodiment, the sealing member 401 may include the above described polymer material, and in the side surface of the flexible display 300, may be bonded to a region including a space between the cover window 320 and the display panel 330 by means of viscosity of the polymer material.

Figure 4B:
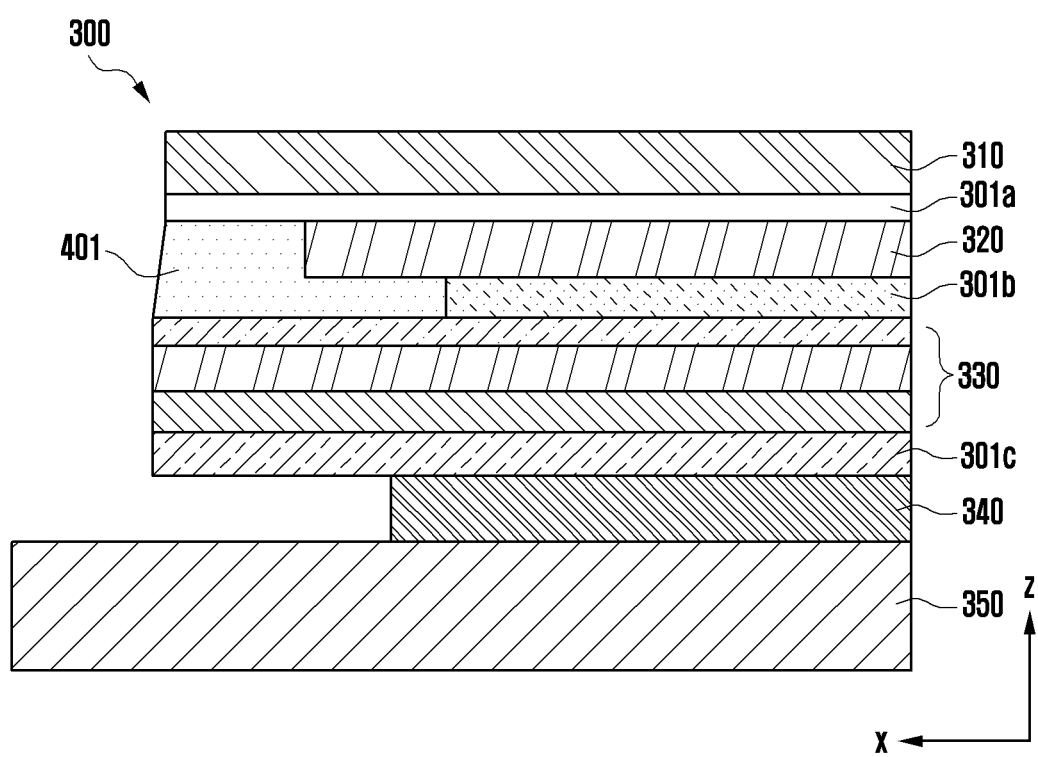

Referring to FIG. 4B, in various embodiments, the sealing member 401 may come into close contact with a region including a space between the lower surface of the protective layer 310 and the upper surface of the display panel 330. A gap may exist in the above described region in order to allow a slip between the protective layer 310 and the cover window 320. The sealing member 401 may come into close contact with a region, in which the above described step exists, to reduce damage of the display panel 330 or a cover glass during a bending operation in a state where foreign materials are introduced thereinto.

Figure 4C:
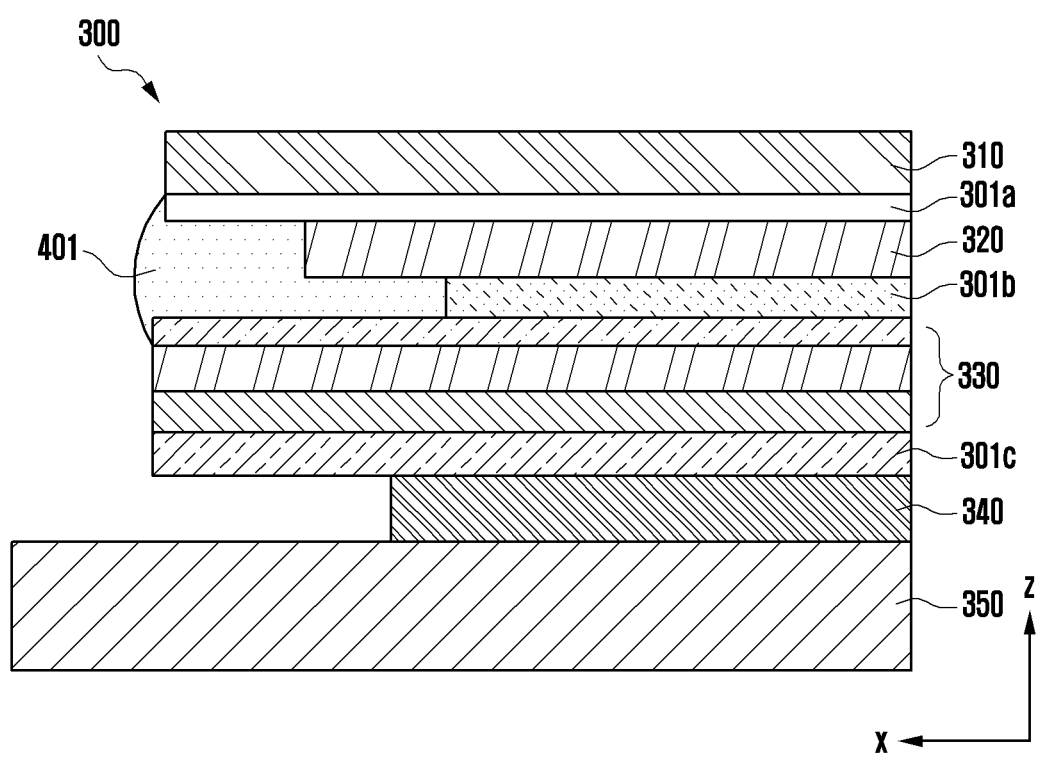

Referring to FIG. 4C, in various embodiments, the sealing member 401 may come into close contact with a space between the lower part of the protective layer 310 and the upper surface of the display panel 330 and a side part of the first adhesive layer 301a. In various embodiments, the sealing member 401 may come into close contact with at least a part of the side part of the display panel 330, for example, a region including a side part of the polarization film. When sealing member 401 is configured to additionally protect the first adhesive layer 301a, the sealing member may reduce damage of the cover glass and the protective layer 310, which is caused by foreign materials invaded into the first adhesive layer 301a.

Figure 4D:
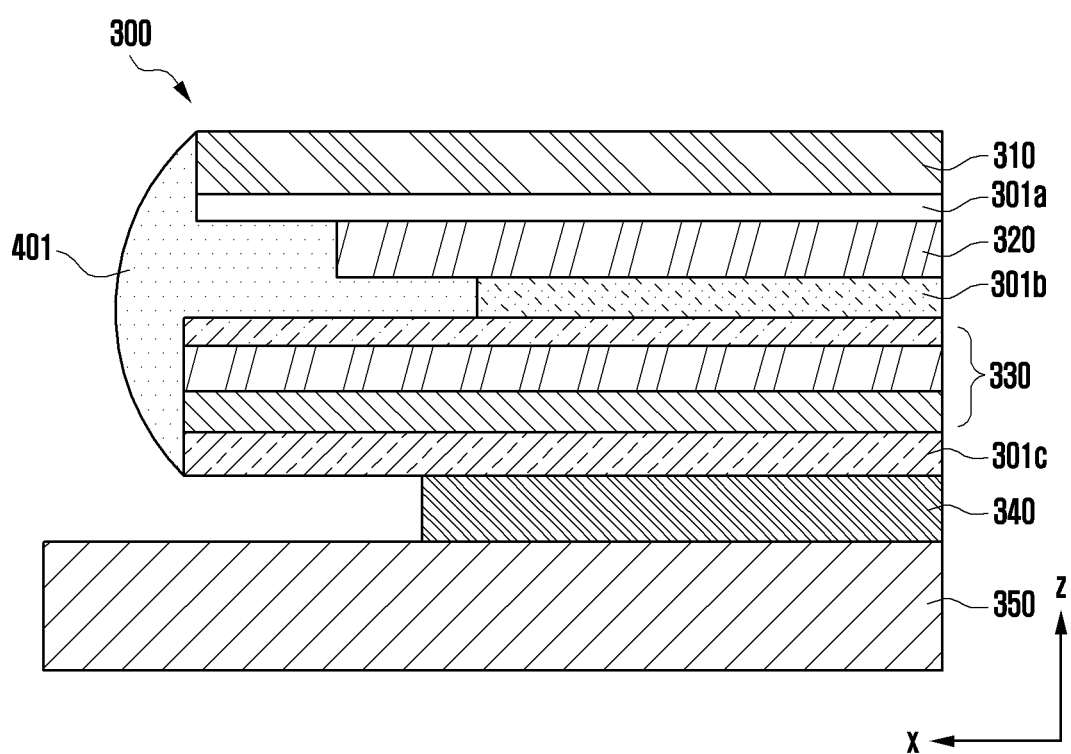
Figure 4E:
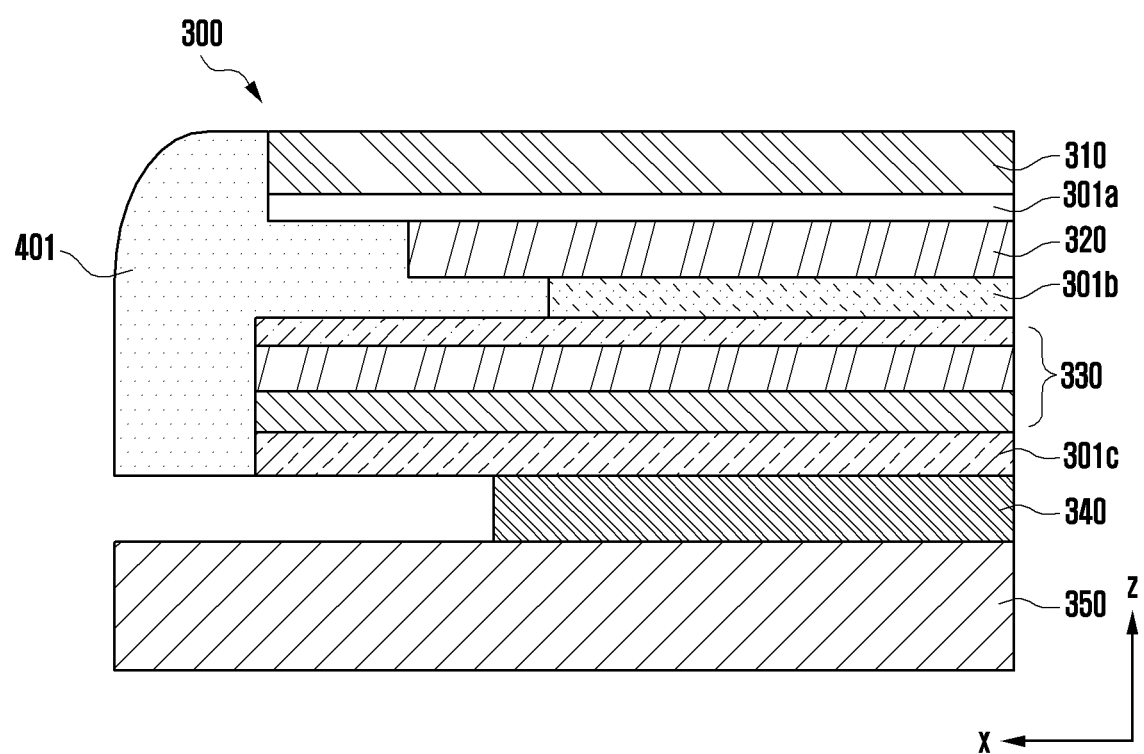

Referring to FIG. 4D and FIG. 4E, the sealing member 401 may come into close contact with a side part of a region between from the upper surface of the protective layer 310 to the lower surface of the display panel 330. When the sealing member 401 is configured to entirely close the side surface of the display panel 330, the sealing member may prevent and/or reduce foreign materials from being introduced into a side surface of the display panel 330. In addition, the sealing member may additionally protect the panel region 332 containing an organic material, which is vulnerable to moisture and oxygen, from inflow of external moisture and oxygen.

Figure 4F:
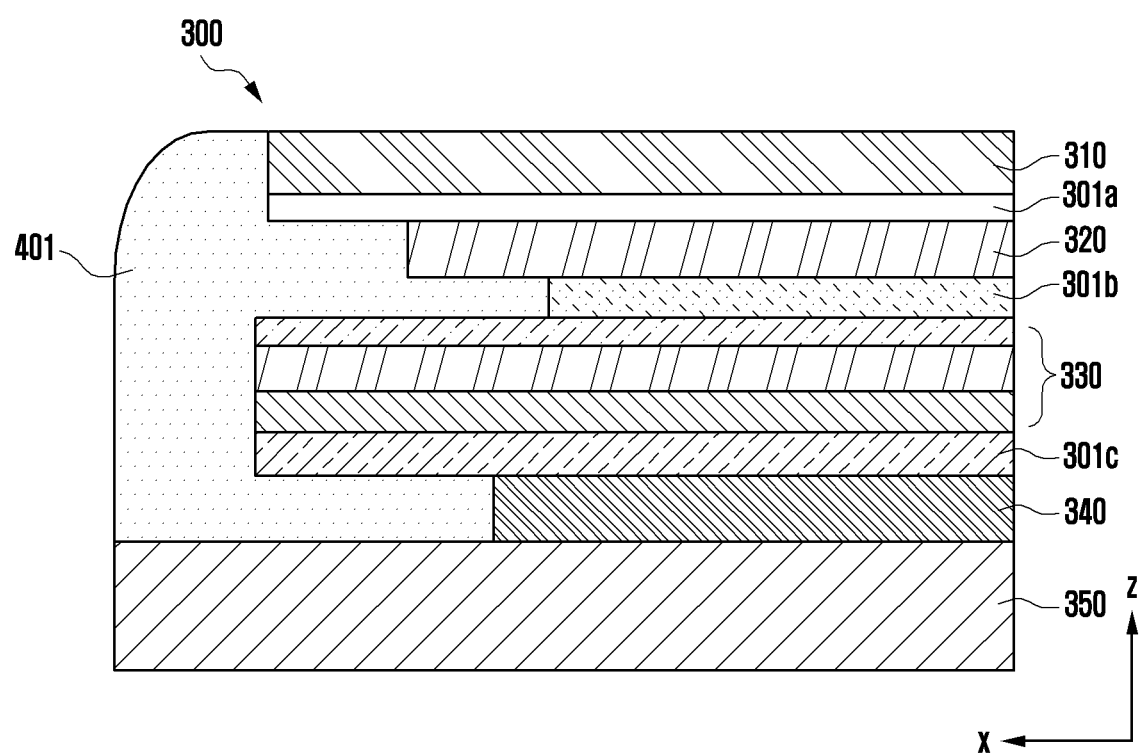

Referring to FIG. 4F, the sealing member 401 may be configured to be in close contact with a side surface part of a portion corresponding to a region between the upper surface of the support layer 350 and the upper surface of the protective layer 310. A gap for allowing a slip on the rear surface of the protective layer 310 may exist in a region between the lower surface of the display panel 330 and the upper surface of the support layer 350. When the sealing member 401 is configured to cover the above described gap, the sealing member may reduce damage of the rear surface of the display panel 330.

Figure 5:
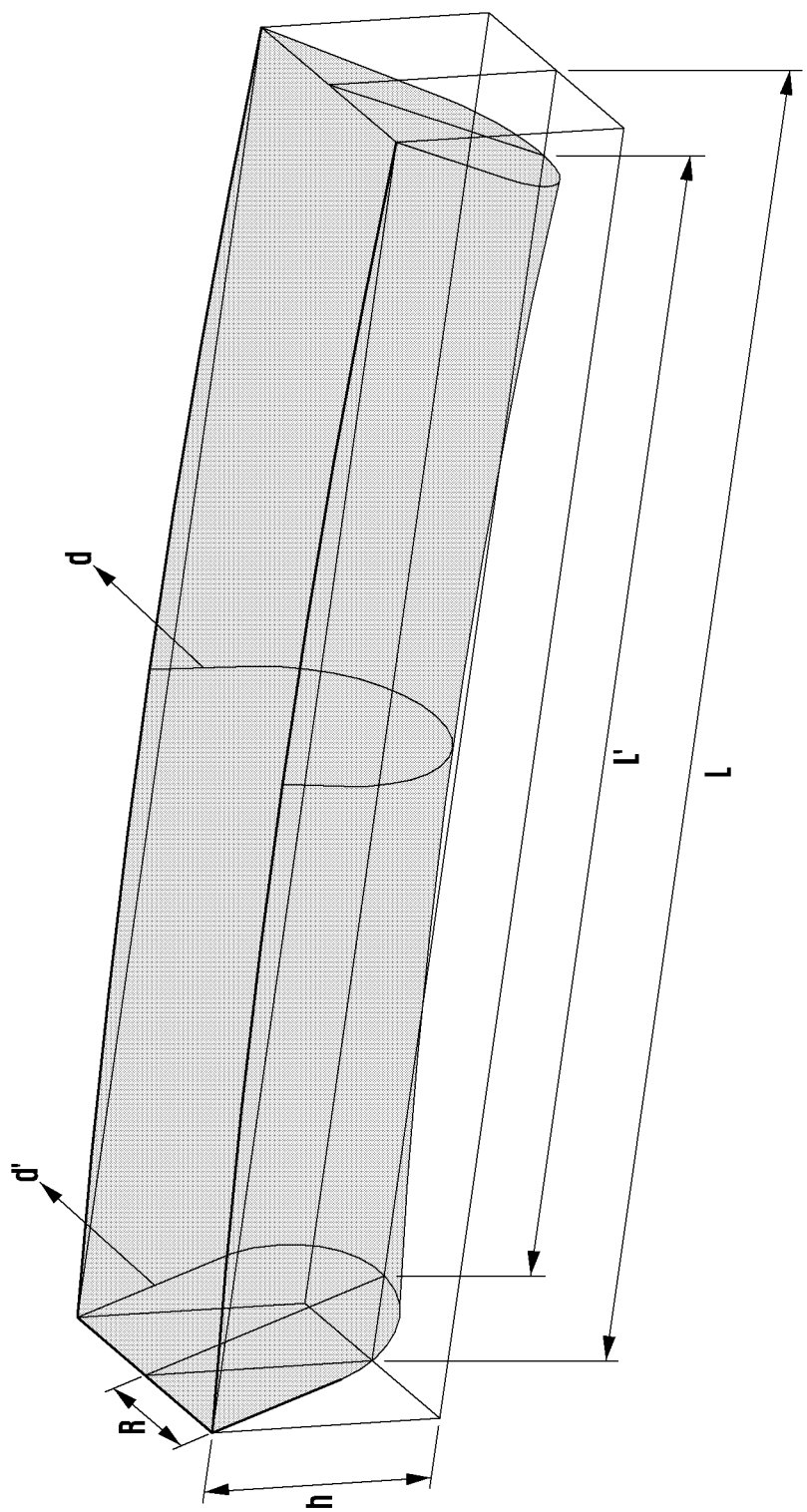
FIG. 5 is a diagram illustrating deformation of a flexible display generated when the flexible display is bent according to various embodiments.

FIG. 5 is a diagram illustrating example deformation of a flexible display 300, which is generated when the flexible display 300 is bent according to various embodiments.

Referring to FIG. 5, when the flexible display 300 having a predetermined (e.g., specified) Poisson's ratio is bent in the width direction thereof, elongation in the lengthwise direction thereof and shrinkage in the width direction, which is caused therefrom, may occur at both ends of a bending axis. The shrinkage amount in the width direction may be expressed as Equation 1 below according to the definition of the Poisson's ratio.

$$\Delta L = L \cdot v \cdot \frac{\Delta d}{d} = L \cdot v \cdot \frac{t}{2R} \quad \text{[Equation 1]}$$

In Equation 1 above, v is the Poisson's ratio of a material, L is the width of flexible display 300, $\Delta L$ is the shrinkage amount (L-L') in the width direction, d is the length of the region in which the flexible display 300 is bent before bending, $\Delta d$ is the elongation amount in the lengthwise direction at the center part thereof, R is the curvature radius of bending, and t is the thickness of the flexible display 300. That is, the elongation in the lengthwise direction at the center thereof may occur as much as the difference between the inner radius and the outer radius according to the thickness of the flexible display 300.

In addition, the elongation in the lengthwise direction of both ends of the flexible display 300 according to the width reduction thereof may be expressed as Equation 2 below.

$$d' = d \cdot \frac{\sqrt{h^2 + \left(\frac{\Delta L}{2}\right)^2}}{h}, h = \frac{d - \pi R}{2} \quad \text{[Equation 2]}$$

In Equation 2, d' is the length between both ends of a display in a bent state. The strain rate (ε) at both ends of the flexible display 300 may be defined as d'/d, the strain rate at both ends of the bent portion of the flexible display 300 may be calculated through the definition of the strain rate and Equations 1 and 2 above.

In addition, Young's law for an elastic strain rate may be expressed as Equation below.

$$E = \sigma/\varepsilon \quad \text{[Equation 3]}$$

In Equation above, E is the elastic modulus of a material, σ is the stress applied to the material, and ε is the strain rate of the material. In various embodiments of the disclosure, the sealing member 401 may be bent according to a bending operation of the flexible display 300, and thus should maintain a state of being in close contact with a side surface of the flexible display 300. Therefore, when the flexible display 300 is bent with a predetermined curvature radius, the sealing member 401 may be also bent with a predetermined strain rate. Accordingly, according to Equation 3 above, it may be known that the sealing member 401 applies greater stress to the flexible display 300 as the sealing member has a higher elastic modulus.

In order to check physical properties required for each shape of the sealing member 401 of the disclosure, polymer materials having different elastic modulus are applied to the shapes of Example 1 to Example 6, respectively, and then the strain generated by the stress, which is applied to the flexible display 300 by the sealing member 401, is measured through CAE analysis by the finite element method. The measured results are shown in Table 1.

TABLE 1

| Modulus (Mpa) | Example 1 | Example 2 | Example 3 | Example 4 | Example 5 | Example 6 |
|---|---|---|---|---|---|---|
| 1 | 0.011 | 0.015 | 0.025 | 0.026 | 0.026 | 0.028 |
| 5 | 0.014 | 0.019 | 0.028 | 0.029 | 0.029 | 0.031 |
| 10 | 0.017 | 0.022 | 0.033 | 0.033 | 0.038 | 0.044 |
| 20 | 0.018 | 0.025 | 0.036 | 0.036 | 0.041 | 0.046 |
| 30 | 0.028 | 0.036 | 0.045 | 0.046 | 0.051 | 0.053 |

In the above Table 1, Example 1 to Example 6 are examples including the sealing members 401 having the shapes illustrated in FIGS. 4A to 4F, respectively. Strain may be a dimensionless number.

Referring to Table 1, the strain generated by the sealing member 401 may increase according to the increase of elastic modulus of the sealing member 401, and it may be known that the strain increases as a region covered by the sealing member 401 in the side surface of the flexible display 300 increases in the thickness direction thereof (the z-axis direction of FIGS.). Therefore, in order to prevent or reduce excessive stress from being applied to the flexible display 300 while covering a region as large as possible in the side surface of the flexible display 300, it may be preferable that the elastic modulus of the sealing member 401 is as low as possible.

Empirically, when the strain, which is applied to the flexible display 300 by the sealing member 401, exceeds 0.03, damage or defect of the flexible display 300 has occurred. With reference to same, referring to Table 1 again, it may be preferable that the elastic modulus of the sealing member 401 is 5 Mpa or less as much as possible.

In addition, the sealing member 401 may elongate when the flexible display 300 is bent. Therefore, in order to reduce cracking of the sealing member 401 due to the elongation thereof and maintain a close contact state with the flexible display 300 during bending, it may be preferable that the sealing member 401 has a high elongation. Empirically, in order to maintain durability even at the time of bending and unbending of 100,000 times or more, it was identified that the sealing member 401 should have an elongation of at least 300%.

If the polymer material has the above described elastic modulus and elongation, damage of flexible display 300, cracking of the sealing member, or the problem in which the sealing member is detached from the side surface of the flexible display 300, which may occur during a bending operation in a state where the sealing member 401 is in close contact with the side surface of the flexible display 300, may be reduced, so that the side surface of the flexible display 300 can be protected from ingress of foreign materials.

Figure 6:
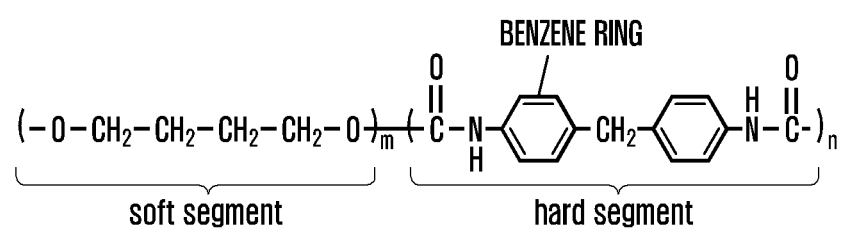
FIG. 6 is a diagram of a molecular structure of a polymer material of a sealing member according to various embodiments.

FIG. 6 is a diagram illustrating a molecular structure of a polymer material of a sealing member 401 according to various embodiments.

Referring to FIG. 6, the sealing member 401 according to various embodiments of the disclosure may include the polymer material. The polymer material may include repeating unite each including at least one hard segment and at least one soft segment. FIG. 6 illustrates 1,4-butanediol and Diphenylmethane diisocyanate, but that is merely an example. The sealing member 401 of the disclosure may include at least one of various polymer materials having physical properties suitable for achieving the purpose of the disclosure, and for example, may include at least one of a silicone resin, an amino resin, an epoxy resin, a phenol resin, a polyester resin, or a polyurethane resin. When the polymer material has an elastic modulus of 5 MPa or less and an elongation of 300% or more, the polymer material may have a Shore A hardness of 10 to 80. As described above, the sealing member 401 of the disclosure may have a low elastic modulus of 5 MPa or less and a high elongation of 300% or more. To this end, the polymer material of the sealing member 401 may have a polymer chain in which the above described repeating units are linearly coupled and which has an average molecular weight of 100,000 or more, and multiple polymer chains are atypically tangled with each other to.

In an embodiment, the polymer material of the sealing member 401 may have the above-described physical properties implemented by adjusting a pendant element or molecular structure in a side chain structure with respect to a linear main chain or by adjusting the branch ratio thereof.

In an embodiment, the polymer material of the sealing member 401 may include a light and/or UV-curable polymer such as epoxy acrylate, urethane acrylate, unsaturated polyester resin, polyester acrylate, polyether acrylate or unsaturated acrylic resin. The above described light and/or UV-curable polymer may have a low elastic modulus and a high elongation implemented due to the selection of an appropriate main chain segment, and a side chain attached by a polyfunctional crosslinking.

In various embodiments, the polymer material of the sealing member 401 may be applied to the side surface of the flexible display 300 in a solution state. The solution of the polymer material may be applied to the side surface of the flexible display 300 through a spray process such as jetting or spraying. After that, the sealing member 401 may be cured by a curing process including heat curing, UV curing, room temperature curing, moisture curing, or hybrid curing in which two or more of the above described multiple curing methods are mixed. Jetting of a polymer solution may be that a polymer solution is sprayed through a nozzle including a fine spray hole, and the method may have an advantage in that a polymer solution can be in close contact with the side surface of the flexible display 300, which has a gap of several tens of micrometer levels.

In various embodiments, the polymer material of the sealing member 401 may have a viscosity of 1000 to 10,000 cPs in a solution state. When the viscosity of the polymer solution is 1000 cPs or less, it may be impossible that the shape of an elastic member is maintained until the polymer material is cured by a curing process after being applied to the side surface of the flexible display 300. In addition, when the viscosity of the polymer solution exceeds 10,000 cPs, it may be difficult that a polymer solution having an excessively high viscosity passes through a jetting nozzle.

Figure 7:
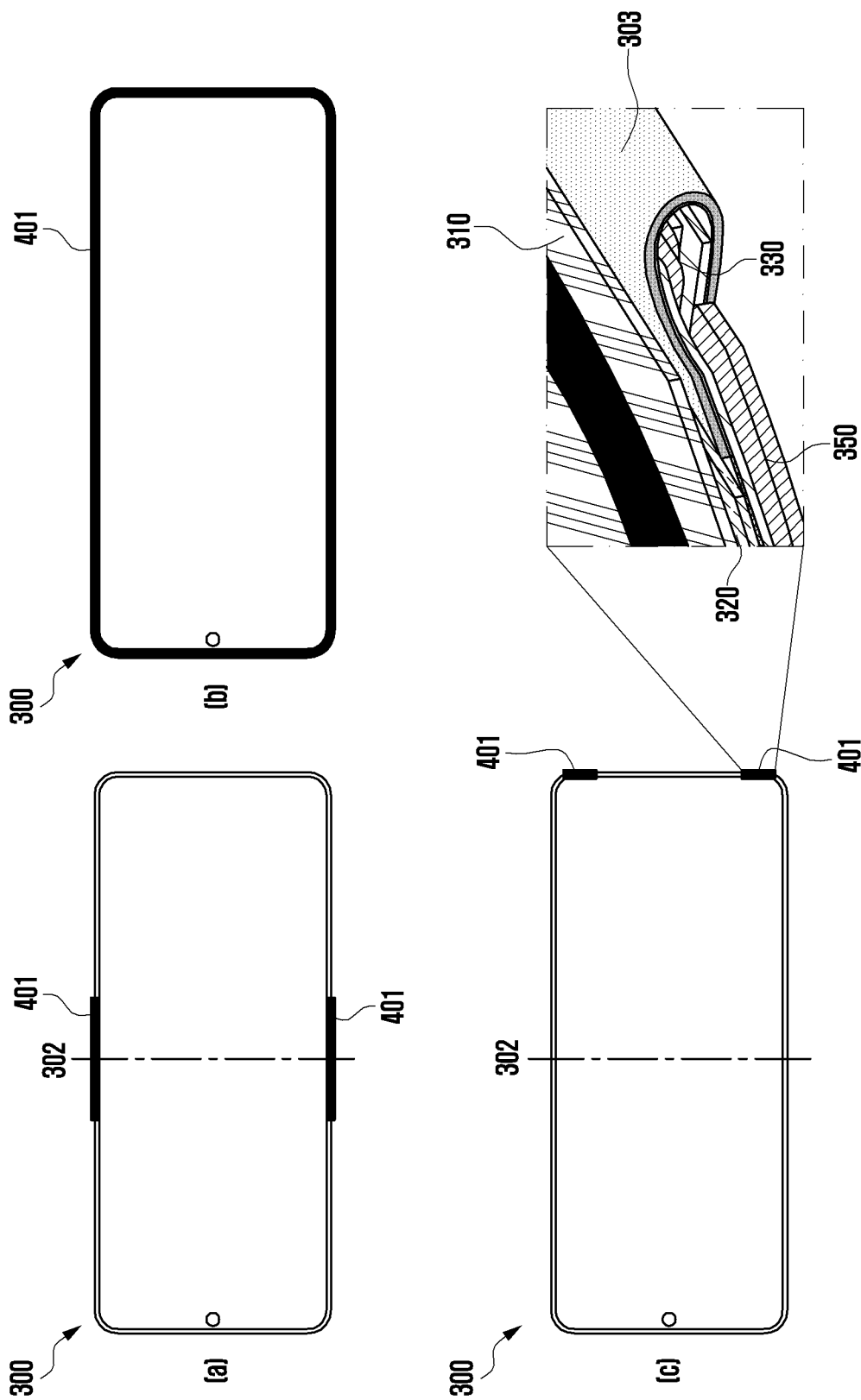
FIG. 7 is a diagram illustrating an example application location of a sealing member for a flexible display according to various embodiments.

FIG. 7 includes various views illustrating an application location of a sealing member 401 for a flexible display 300 according to various embodiments.

Referring to (a) of FIG. 7, the sealing member 401 according to various embodiments may be applied to both ends of a region including a portion to be bent during a bending operation around the bending axis 302 of the flexible display 300. When foreign materials have been introduced thereinto, the portion to be bent during a bending operation may be a portion in which the most possibility of being damaged by the foreign materials pressing the flexible display 300 exists. Therefore, it may be preferable to apply the sealing member 401 to the above described region.

Referring to (b) of FIG. 7, in an embodiment, the sealing member 401 may be also applied to the entire side surface of the flexible display 300 along the outer circumferential surface of the side surface of the flexible display 300. The multiple layers of the flexible display 300 may be slipped away from each other during a bending operation, and thus may be vulnerable to foreign materials. In addition, the side surface of the flexible display 300 may be a portion, which is highly likely to be exposed to the outside and has an OLED having an organic material vulnerable to moisture or oxygen. Therefore, it may be preferable to entirely close the side surface of the flexible display 300 using the sealing member 401.

Referring to (c) of FIG. 7, in an embodiment, the sealing member 401 may be also applied to a COP bending part 303 positioned at an end in a direction perpendicular to the bending axis of the flexible display 300. A chip on panel (COP) may include a flexible substrate on which a driving circuit including a display driver IC (DDI) for driving the flexible display 300 is positioned. In order to electrically connect a driving circuit and a printed circuit board (e.g., the first substrate assembly 261 and/or the second substrate assembly 262 of FIG. 2F) of an electronic device, the COP bending part 303 may include a region in which a COP is curved or bent downward of the flexible display 300. In various embodiments, the side surface of the COP bending part 303 may be surrounded by the sealing member 401. For example, the sealing member 401 may be in close contact with at least one layer included in the flexible display 300 corresponding to the side surface of the COP bending part 303 and/or with the gap between the layers.

The COP bending part of the flexible display 300 may be vulnerable to electrostatic discharge (ESD). The polymer material of the sealing member 401 may have low electrical conductivity, and thus may prevent and/or reduce elements of the flexible display 300 from be damaged by the ESD. Therefore, it may be preferable that the sealing member 401 is applied to the COP bending part.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A foldable electronic device comprising:
a foldable housing configured to be folded and unfolded;
a flexible display disposed in the foldable housing, the flexible display comprising a display panel configured to display image information and a cover window covering a first surface of the display panel on which image information is displayed and a protective layer covering an upper part of the cover window, the display panel having at least one portion configured to be bend according to folding and unfolding operations of the foldable housing; and
a seal in contact with a side part of the flexible display with reference to the first surface of the flexible display, a space between the cover window and the display panel, and a space between the protective layer and the cover window, wherein
the seal comprises a polymer material configured to be bent according to the bent operation in a state of being in contact with a side surface of the flexible display during the bending operation of the flexible display.

2. The foldable electronic device of claim 1, wherein the polymer material has an elastic modulus of 5 Mpa or less, an elongation of 300% or more, and a Shore A hardness of 10 to 80.

3. The foldable electronic device of claim 1, wherein the polymer material comprises a structure in which polymer chains are atypically tangled with other, the polymer chain having repeating units, each of the repeating units including at least one soft segment and at least one hard segment and has an average molecular weight of 10000 or more, the repeating units being linearly polymerized.

4. The foldable electronic device of claim 1, wherein the polymer material comprises at least one of silicon resin, amino resin, epoxy resin, phenol resin, polyester, or polyurethane.

5. The foldable electronic device of claim 1, wherein the seal is in contact with the side surface of the display, wherein the seal comprises a sprayed and cured polymer material contacting the side surface of the flexible display.

6. The foldable electronic device of claim 5, wherein the polymer material has a viscosity of 1000 to 10000 cPs in a solution state.

7. The foldable electronic device of claim 1, wherein
the seal is in contact with a side part of a region comprising a space between the protective layer and the display panel.

8. The foldable electronic device of claim 1, wherein the flexible display comprises a first adhesive layer bonding the protective layer and the cover window together, and
the seal is in contact with a region comprising a side part of the first adhesive layer and a region between the lower surface of the first adhesive layer and the upper surface of the display panel.

9. The foldable electronic device of claim 1, wherein the seal is in contact with a region comprising a side part of the protective layer, a region between the protective layer and the display panel, and a side part of the display panel.

10. The foldable electronic device of claim 1, wherein the flexible display comprises:
a rear cover positioned below the display panel; and
a support layer positioned below the rear cover, and
the seal is in contact with a region of a side part of the display panel between the upper surface of the support layer and the upper surface of the protective layer.

11. The foldable electronic device of claim 1, wherein the seal is disposed on a side part of a portion of the flexible display, which is bent during the folding operation of the foldable housing.

12. The foldable electronic device of claim 1, wherein the flexible display comprises a chip on panel (COP) bending part positioned at an end in a direction perpendicular to an axis in which the bending operation is configured to be performed, and
the seal is disposed at the COP bending part of the flexible display.

13. The foldable electronic device of claim 1, wherein the seal is disposed at an entire side part of the flexible display with reference to a first direction.

14. A flexible display of a foldable electronic device, comprising:
a display panel configured to display image information;
a cover window covering a first surface of the display panel on which image information is displayed;
a protective layer covering an upper part of the cover window; and
a seal contacting a side part of the flexible display with reference to the first surface of the flexible display, a space between the cover window and the display panel, and a space between the protective layer and the cover window, wherein
the flexible display has at least one portion configured to be bent according to folding and unfolding operations of the foldable electronic device, and
the seal comprises a polymer material configured to be bent according to the bending operation while maintaining a state of being in contact with a side surface of the flexible display during the bending operation.

15. The flexible display of an electronic device of claim 14, wherein the polymer material has an elastic modulus of 5 Mpa or less, an elongation of 300% or more, and a Shore hardness of 50 to 100.

16. The flexible display of a foldable electronic device of claim 14, wherein the polymer material has a structure in which polymer chains are atypically tangled with other, the polymer chain having repeating units, each of the repeating units including at least one soft segment and at least one hard segment and has an average molecular weight of 10000 or more, wherein the repeating units are linearly polymerized.

17. The flexible display of a foldable electronic device of claim 14, wherein the seal is in contact with the side surface of the display, wherein the seal comprises a sprayed and cured polymer material disposed on the side surface of the flexible display.

18. The flexible display of a foldable electronic device of claim 17, wherein the polymer material has a viscosity of 1000 to 10000 cPs in a solution state.

19. The flexible display of a foldable electronic device of claim 14, wherein
the seal is in contact with a side part of a region comprising a space between the protective layer and the display panel.

20. The flexible display of a foldable electronic device of claim 14, wherein the flexible display comprises:
a rear cover positioned below the display panel; and
a support layer positioned below the rear cover, and
the seal is in contact with a region of a side part of the display panel between the upper surface of the support layer and the upper surface of the protective layer.

* * * * *